(12) United States Patent
Oohara et al.

(10) Patent No.: US 8,461,052 B2
(45) Date of Patent: Jun. 11, 2013

(54) SEMICONDUCTOR DEVICE MANUFACTURING METHOD

(75) Inventors: Junji Oohara, Nisshin (JP); Kazushi Asami, Okazaki (JP)

(73) Assignee: DENSO CORPORATION, Kariya (JP)

( * ) Notice: Subject to any disclaimer, the term of this patent is extended or adjusted under 35 U.S.C. 154(b) by 268 days.

(21) Appl. No.: 13/073,173

(22) Filed: Mar. 28, 2011

(65) Prior Publication Data

US 2011/0244687 A1 Oct. 6, 2011

(30) Foreign Application Priority Data

Mar. 30, 2010 (JP) .................................. 2010-78251

(51) Int. Cl.
*H01L 21/461* (2006.01)
(52) U.S. Cl.
USPC ........... 438/706; 438/707; 438/708; 438/709; 438/710; 438/711; 438/712; 438/713; 438/714; 438/719
(58) Field of Classification Search
None
See application file for complete search history.

(56) References Cited

U.S. PATENT DOCUMENTS

| | | | |
|---|---|---|---|
| 6,051,503 A | 4/2000 | Bhardwaj et al. | |
| 6,187,685 B1 | 2/2001 | Hopkins et al. | |
| 2004/0023508 A1* | 2/2004 | Chinn et al. | 438/710 |
| 2004/0238489 A1 | 12/2004 | Johnson et al. | |
| 2005/0054153 A1* | 3/2005 | Asami et al. | 438/202 |
| 2005/0287815 A1* | 12/2005 | Lai et al. | 438/710 |
| 2006/0006139 A1 | 1/2006 | Johnson et al. | |
| 2010/0105209 A1* | 4/2010 | Winniczek et al. | 438/696 |
| 2011/0097903 A1* | 4/2011 | Nozawa et al. | 438/714 |

FOREIGN PATENT DOCUMENTS

| | | |
|---|---|---|
| JP | A-05-072133 | 3/1993 |
| JP | A-2002-158214 | 5/2002 |
| JP | A-2008-186991 | 8/2008 |
| JP | A-2010-287823 | 12/2010 |

OTHER PUBLICATIONS

Office Action mailed May 29, 2012 in corresponding JP Application No. 2010-078251 (and English translation).

* cited by examiner

*Primary Examiner* — Duy Deo
(74) *Attorney, Agent, or Firm* — Posz Law Group, PLC

(57) ABSTRACT

In a process for forming trenches having M different widths in a substrate, a passivation step and an etching step are alternately performed. The passivation step includes depositing a passivation layer on a bottom of the trenches by converting gas introduced in a chamber into plasma. The etching step includes removing the passivation layer on the bottom of the trenches and applying reactive ion etching to the bottom to increase a depth of the trenches. The etching step further includes setting energy for the reactive ion etching to a predetermined value when the passivation layer on the bottom of the trench having the Nth smallest width is removed. The value allows the etching amount of the trench having the Nth smallest width to be equal to or greater than the etching amount of the trench having the (N+1)th smallest width.

12 Claims, 16 Drawing Sheets

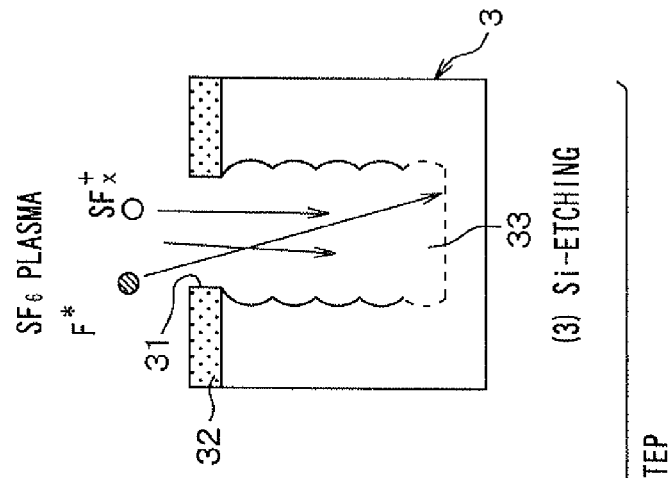
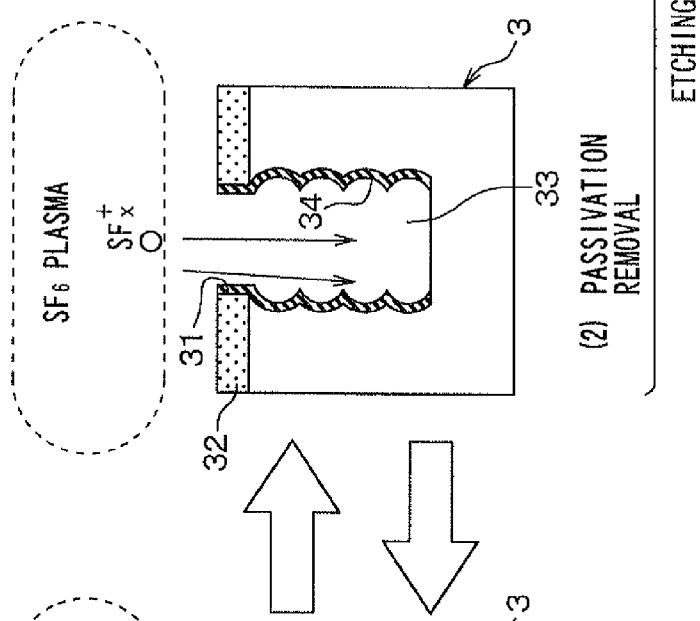
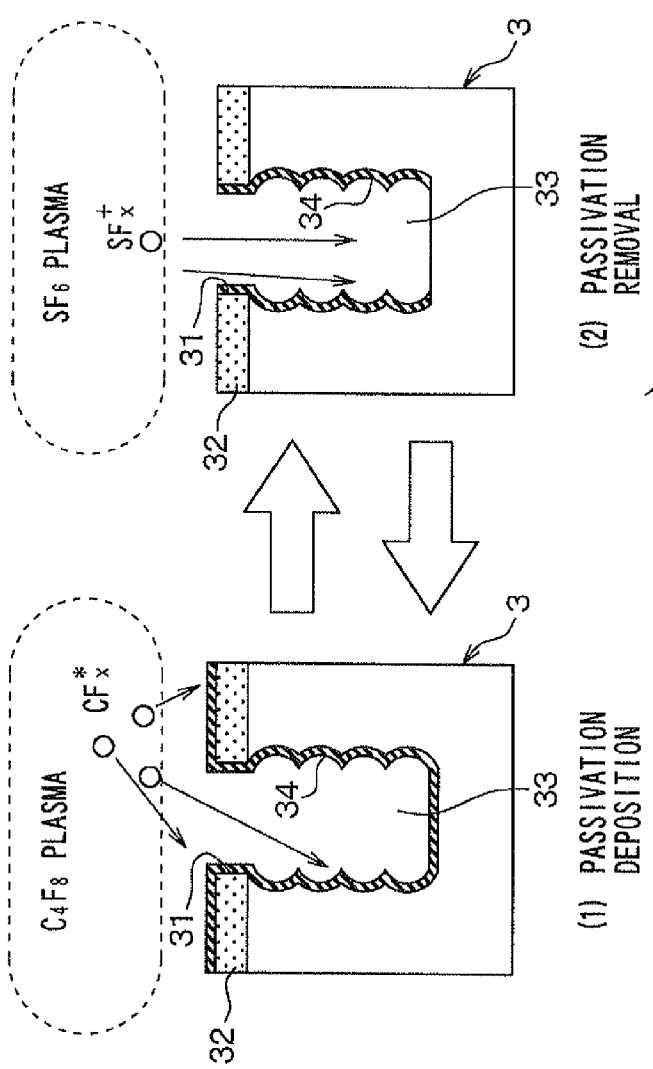

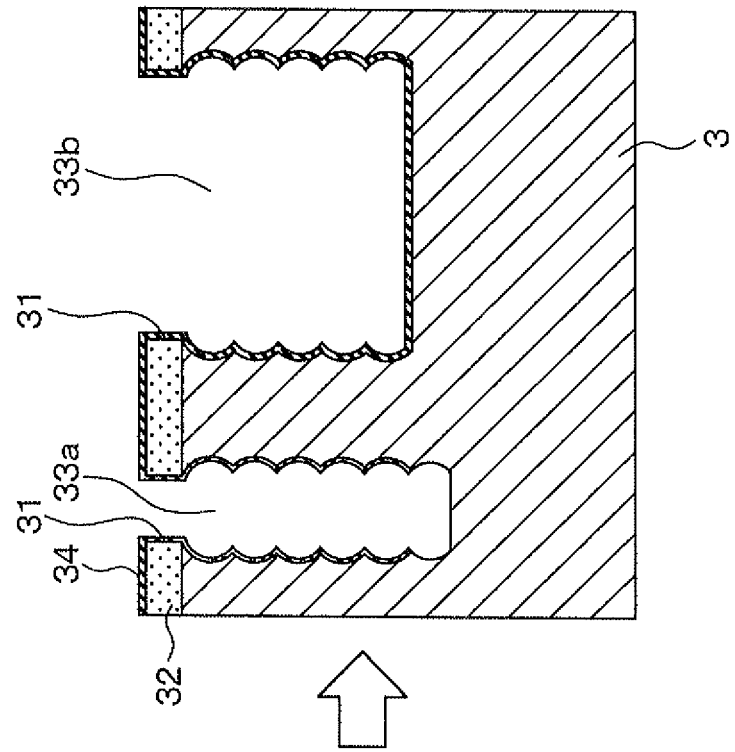
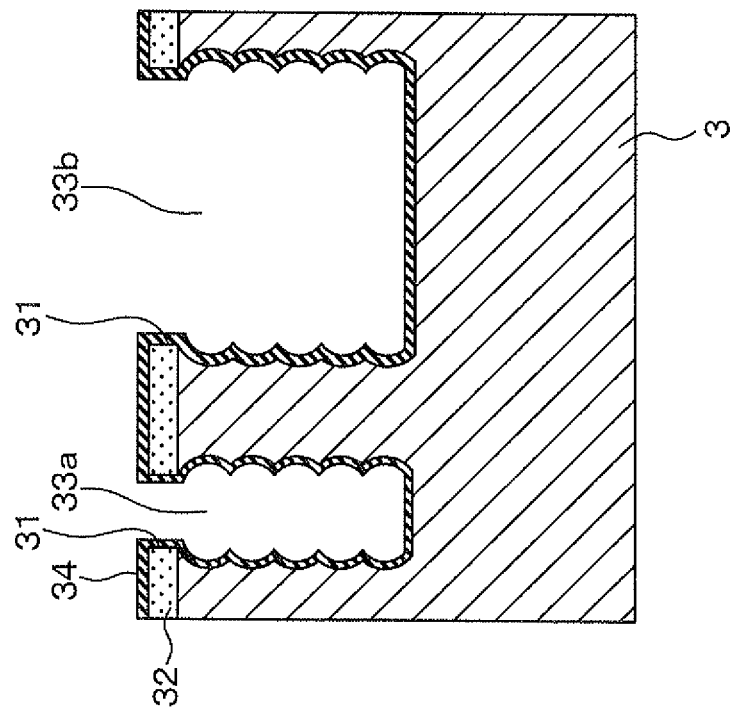

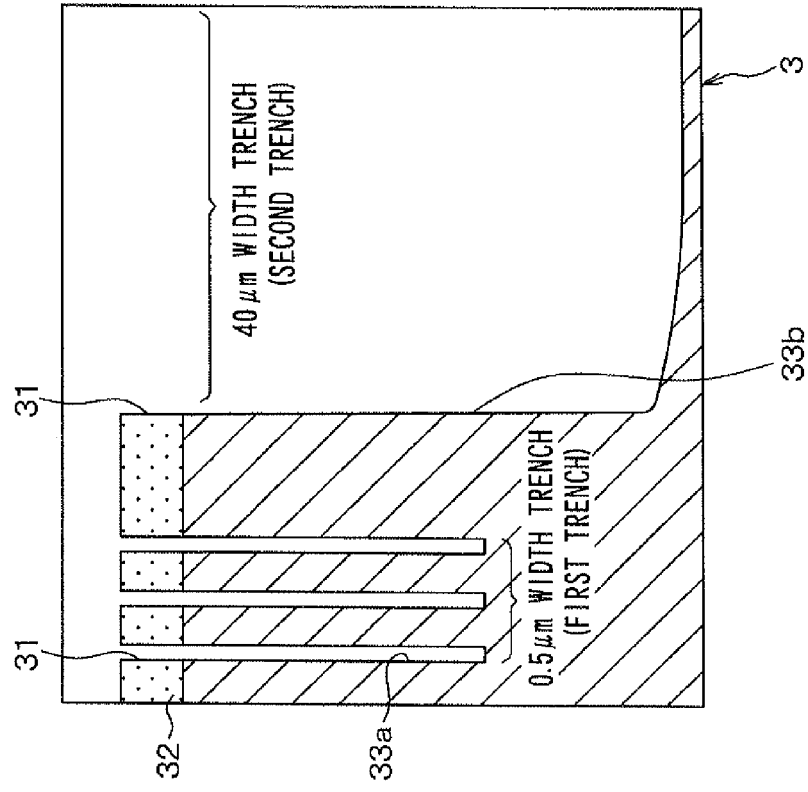
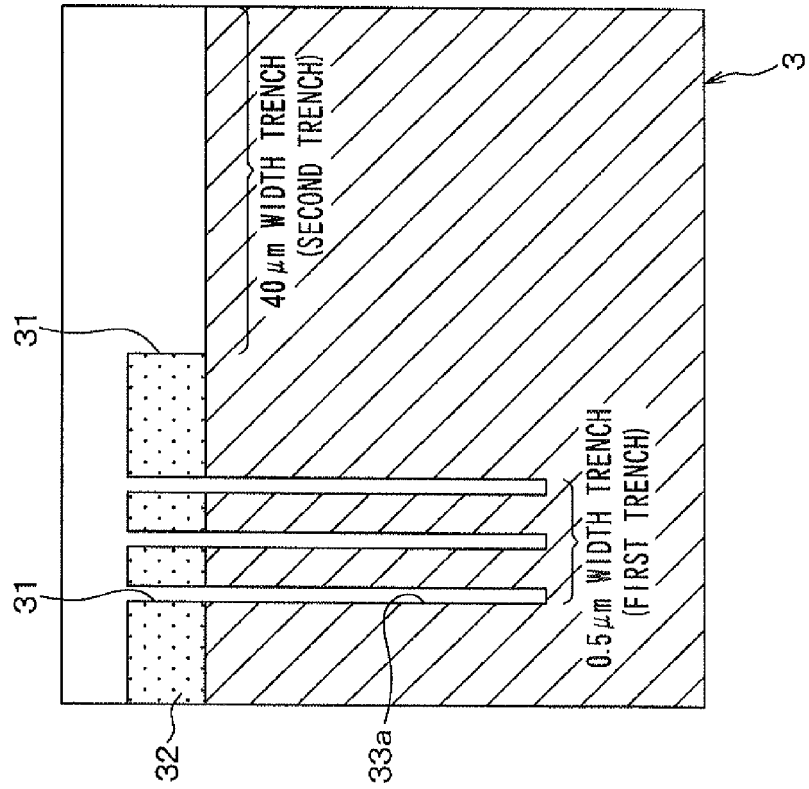

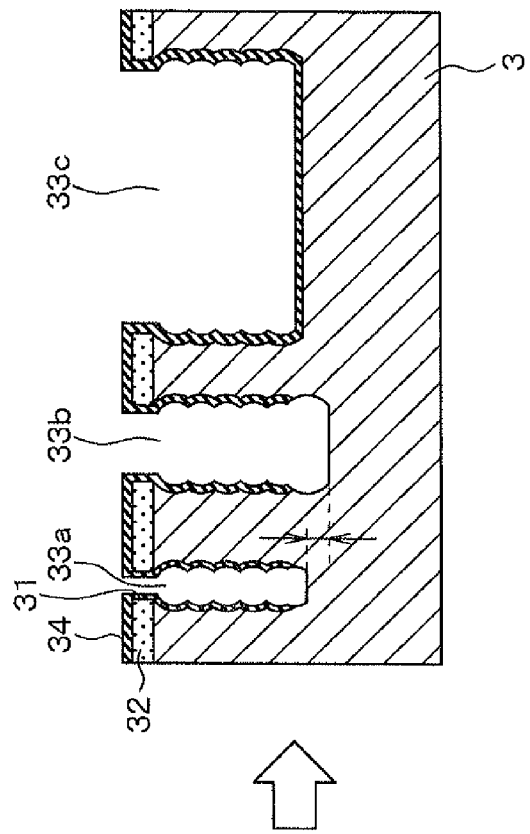
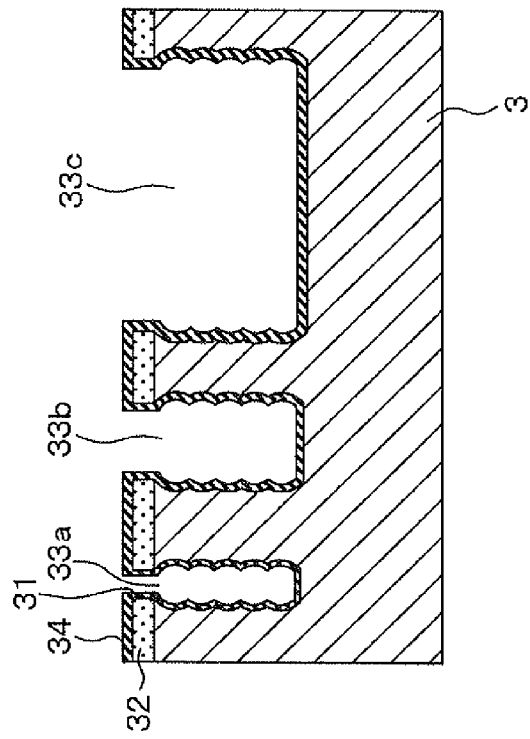

SEMICONDUCTOR DEVICE MANUFACTURING METHOD

CROSS REFERENCE TO RELATED APPLICATION

This application is based on and claims priority to Japanese Patent Application No. 2010-78251 filed on Mar. 30, 2010, the contents of which are incorporated herein by reference.

FIELD OF THE INVENTION

The present invention relates to a semiconductor device manufacturing method in which trenches having different widths are simultaneously formed in a substrate.

BACKGROUND OF THE INVENTION

When a trench is formed in a silicon (Si) substrate by a dry etching technique, the etching rate depends on a width of an opening of a mask. The dependence of the etching rate on the opening width of the mask is known as the "RIE-lag". Due to the RIE-lag, it is difficult to simultaneously form trenches having the same depth and different widths in a Si substrate. FIG. 18 is a diagram illustrating a relationship between a depth of a trench and a width of an opening of a mask when the trench is formed by a dry etching technique using the mask. As can be seen from FIG. 18, the trench depth is almost constant in a range where the mask opening width is greater than a certain level. In contrast, the trench depth decreases with a decrease in the mask opening width in a range where the mask opening width is less than the certain level.

As disclosed, for example, in JP 2002-158214 A, it is possible to simultaneously form trenches having the same depth and different widths in a silicon-on-insulator (SOI) substrate. Since a buried oxide layer of the SOI substrate can serve as an etching stopper, the depths of trenches having different widths can be made equal by etching the trenches until the trenches reach the buried oxide layer.

However, since a SOI substrate is much more expensive than a Si substrate. Therefore, there is a need for a technique to form trenches having the same depth and different widths in a Si substrate. That is, there is a need for a technique to form trenches having different widths in a Si substrate by controlling the depths of the trenches independently.

In JP 2010-287823 A, which was filed by the present inventor, a double-layer structure passivation layer having an oxide layer and a polymer protection layer is formed on inner walls of trenches having different widths to reduce the RIE-lag so that the depths of the trenches can be made equal.

However, according to the method disclosed in JP 2010-287823 A, it is difficult to reduce the RIE-lag, if an aspect ratio of the trench is outside a certain RIE-lag reduction range. Further, since the passivation layer has a double-layer structure, manufacturing time is increased.

Specifically, as the etching depth become larger, it is more likely that the passivation layer remains on the bottom of the trench so that silicon needles (i.e., so-called "black silicon") can be formed on the bottom of the trench. The present inventor conducted an experiment to measure the RIE-lag reduction range. FIG. 19 is a diagram illustrating a result of the experiment. As can be seen from FIG. 19, when the aspect ratio of the trench is greater than about 20, the depths of the trenches are not made equal, and the black silicon is formed in the trenches.

Further, since the passivation layer has a double-layer structure, there is a need to perform a step of forming a layer and a step of removing the layer for each layer of the passivation layer. As a result, the manufacturing time is increased.

SUMMARY OF THE INVENTION

In view of the above, it is an object of the present invention to provide a method of manufacturing a semiconductor device by controlling depths of trenches having different widths independently without an increase in manufacturing time.

According to an aspect of the present invention, a method of manufacturing a semiconductor device includes preparing a wafer having a silicon layer on which a mask having openings is located. The openings have M different widths, where M is a positive integer more than one. The method further includes placing the wafer in a chamber and forming trenches simultaneously in the silicon layer through the mask. The trenches have M different widths defined by the openings of the mask. The forming includes alternately and repeatedly performing a passivation step and an etching step. The passivation step includes depositing a polymer passivation layer on a side wall and a bottom of the trenches by converting gas introduced in the chamber into plasma. The etching step includes removing the passivation layer on the bottom of the trenches until the silicon layer is exposed to the bottom and applying reactive ion etching to the exposed silicon layer to increase a depth of the trenches. The etching step further includes setting incident ion energy for the reactive ion etching to a predetermined energy value when the passivation layer on the bottom of the trench having the Nth smallest width is removed, where N is a positive integer less than M. The energy value allows the etching amount of the silicon layer at the bottom of the trench having the Nth smallest width to be equal to or greater than the etching amount of the silicon layer at the bottom of the trench having the (N+1)th smallest width within a remaining time of the present etching step.

According to another aspect of the present invention, a method of manufacturing a semiconductor device includes preparing a wafer having a silicon layer on which a mask having openings is located. The openings have M different widths, where M is a positive integer more than one. The method further includes placing the wafer in a chamber and forming trenches simultaneously in the silicon layer through the mask. The trenches have M different widths defined by the openings of the mask. The forming includes alternately and repeatedly performing a passivation step and an etching step. The passivation step includes depositing a polymer passivation layer on a side wall and a bottom of the trenches by converting gas introduced in the chamber into plasma. The etching step includes removing the passivation layer on the bottom of the trenches until the silicon layer is exposed to the bottom and applying reactive ion etching to the bottom to increase a depth of the trenches. The etching step further includes setting incident ion energy for the reactive ion etching to a predetermined energy value after a predetermined lapse time from when the passivation layer on the bottom of the trench having the smallest width is removed. The energy value prevents the passivation layer from being removed.

BRIEF DESCRIPTION OF THE DRAWINGS

The above and other objectives, features and advantages of the present invention will become more apparent from the following detailed description made with check to the accompanying drawings. In the drawings:

FIG. 2A is a cross-sectional view illustrating a passivation step of the trench etching process, FIG. 2B is a cross-sectional view illustrating a passivation layer removal sub-step of an etching step of the trench etching process, and FIG. 2C is a cross-sectional view illustrating a Si-etching sub-step of the etching step;

FIG. 3A is a cross-sectional view illustrating the passivation step performed when two trenches having different widths are simultaneously formed, and FIG. 3B is a cross-sectional view illustrating the etching step performed when the trenches are simultaneously formed;

FIG. 7A is a diagram illustrating the trenches formed by the etching process according to the first embodiment, and FIG. 7B is a diagram illustrating the trenches formed by a normal etching process;

FIG. 12A is a cross-sectional view illustrating a passivation step performed when three trenches having different widths are simultaneously formed, and FIG. 12B is a cross-sectional view illustrating an etching step, according to the fourth embodiment, performed when the three trenches are simultaneously formed;

DETAILED DESCRIPTION OF THE PREFERRED EMBODIMENTS

Figure 1:
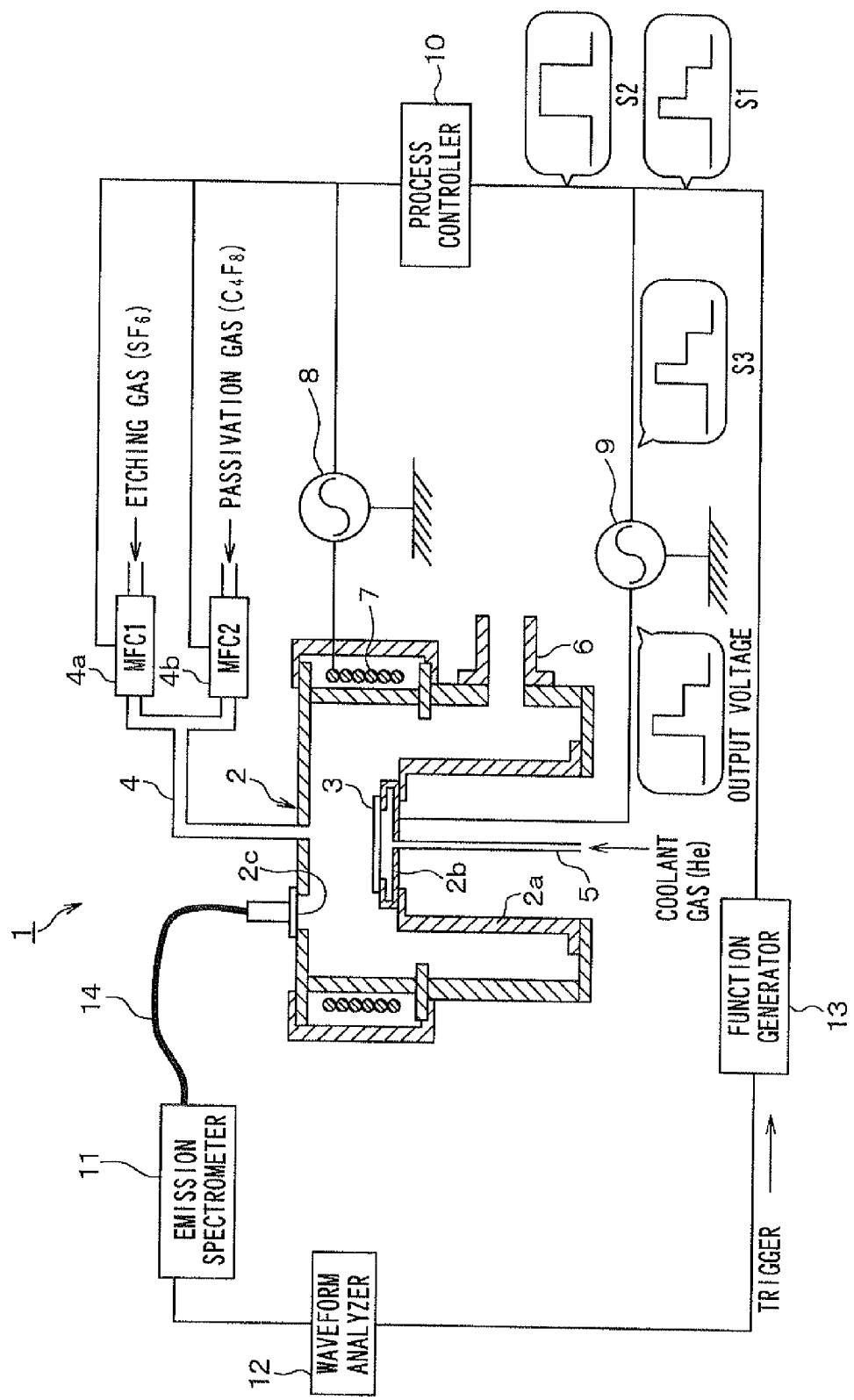
FIG. 1 is a diagram illustrating an etching apparatus used in a trench etching process of a semiconductor device manufacturing method according to a first embodiment of the present invention.

Embodiments of the present invention are described below with reference to the drawings. Throughout the embodiments, the same symbols are given to the same or corresponding parts in the drawings.

First Embodiment

A semiconductor device manufacturing method according to a first embodiment of the present invention is described below with reference to FIG. 1, FIG. 1 is a diagram illustrating an etching apparatus 1 used in a trench etching process (i.e., process for forming a trench) of the manufacturing method.

The etching apparatus 1 has an etching chamber 2 in which a wafer 3 with a mask having an opening is placed. A trench is etched in the wafer 3 by using the mask so that the trench can be formed in the wafer 3 at a position corresponding to the opening. An etching gas inlet line 4, a coolant gas inlet line 5, and an outlet port 6 are connected to the etching chamber 2.

The etching gas inlet line 4 is provided with a first mass flow controller (MFC) 4a and a second mass flow controller (MFC) 4b. The first MFC 4a controls the flow rate of etching gas introduced into the etching chamber 2. For example, the etching gas can be sulfur hexafluoride (SF6). The second MFC 4b controls the flow rate of passivation layer deposition gas introduced into the etching chamber 2. For example, the passivation layer deposition gas can be octafluorocyclobutane (C4F8). The coolant gas inlet line 5 is connected to a base 2a where the wafer 3 is placed, so that the wafer 3 can be cooled from its back side by coolant gas introduced through the coolant gas inlet line 5. For example, the coolant gas can be helium (He). The outlet port 6 controls the degree of vacuum in the etching chamber 2 by removing gas from the etching chamber 2 by using a vacuum pump or the like. Specifically, the amount of gas introduced through the etching gas inlet line 4 into the etching chamber 2 and the amount of gas removed through the outlet port 6 from the etching chamber 2 is controlled to determine the degree of vacuum in the etching chamber 2 by equilibrium state between the introduced gas amount and the removed gas amount.

The etching chamber 2 has a radio frequency (RF) coil 7. The RF coil 7 is supplied with power from a plasma RF power source 8. RF power of the RE coil 7 is adjusted based on the power supply from the plasma RF power source 8 so that the gas introduced into the etching chamber 2 can be converted into plasma. For example, C4F8 gas can be converted into CFx*, and SF6 gas can be converted into SFx$^+$.

The base 2a of the etching chamber 2 is provided with an electrode 2b to which a voltage is applied by a bias RF power source 9. The bias RF power source 9 is independent of the plasma RF power source 8. A RF electric field for ion acceleration is produced between the plasma and the wafer 3 by applying the voltage to the electrode 2b. Ion incident energy for etching can be adjusted by adjusting bias RF power of the bias RF power source 9.

The etching apparatus 1 is controlled by a process controller 10, an emission spectrometer 11, a waveform analyzer 12, and a function generator 13.

The process controller 10 outputs control signals to the first MFC 4a, the second MFC 4b, the plasma RF power source 8, and the bias RF power source 9 so that a passivation step and an etching step of the etching process can be alternately and repeatedly performed every several seconds, for example.

FIGS. 2A-2C are diagrams illustrating the trench etching process. Specifically, FIG. 2A is a cross-sectional view illustrating the passivation step of the trench etching process. FIGS. 2B-2C are cross-sectional views illustrating the etching step of the trench etching process. The passivation step and the etching step are alternately and repeatedly performed by using a mask 32 having an opening 31 so that a trench 33 having a predetermined depth can be etched in the wafer 3. In the passivation step shown in FIG. 2A, a polymer-type passivation layer 34 is deposited in the trench 33 by a chemical vapor deposition (CVD) method. In the etching step shown in FIGS. 2B and 2C, the passivation layer 34 on a bottom of the trench 33 is removed so that a Si layer of the wafer 3 can be exposed to the bottom of the trench 33, and then Si-etching is applied to the exposed Si layer so as to increase the depth of the trench 33.

In the passivation step, the flow rate of C4F8 gas introduced into the etching chamber 2 is controlled by using the first MFC 4a and the second MFC 4b. In the etching step, the flow rate of SF6 gas introduced into the etching chamber 2 is controlled by using the first MFC 4a and the second MFC 4b.

The plasma RF power is controlled independently between in the passivation step and in the etching step. Likewise, the bias RF power is controlled independently between in the passivation step and in the etching step. Since the bias application makes little contribution to passivation layer formation, the bias RF power can be 0 watt (W) in the passivation step. In contrast, in order to remove the passivation layer 34 on the bottom of the trench 33 by ion sputtering effect, there is a need to apply the bias RF power greater than a threshold, which causes the sputtering effect, at an initial stage of the etching step. Then, when the Si-etching is started after the passivation layer 34 on the bottom of the trench 33 is removed, the bias RF power is reduced so that a reverse RIE-lag can be caused. Details for this are described later.

Referring back to FIG. 1, the etching chamber 2 has a chamber window 2c provided with an optical fiber 14. The emission spectrometer 11 measures plasma light emission in the etching chamber 2 through the chamber window 2c and the optical fiber 14 so as to obtain the intensity of emission spectrum of a wavelength to be measured. Specifically, as described later, the emission intensity of F radical in SF6 plasma or C$^+$ ion in C4F8 plasma changes between before and after completion of removal of the passivation layer 34 on the bottom of the trench 33. The emission spectrometer 11 obtains the intensity of an emission peak derived from F radical or C$^+$ ion.

There are several hundreds of emission peaks of F radical in SF6 plasma within the visible range (e.g., from 200 nm to 900 nm). For example, at an emission peak wavelength of 704 nm, the emission intensity is reduced when the Si-etching is started after completion of the removal of the passivation layer 34 on the bottom of the trench 33, because F radical is consumed by an etching reaction with Si. Therefore, it is possible to detect the start of the Si-etching by detecting the reduction in the emission intensity.

Regarding C$^+$ ion, for example, at an emission peak wavelength of 514 nm, the emission intensity gradually decreases as the removal of the passivation layer 34 on the bottom and the side wall of the trench 33 progresses. Then, when the passivation layer 34 is completely removed, the emission intensity reaches a constant value.

For the above reasons, in the emission spectrometer 11, the plasma light emission in the etching chamber 2 is measured using a spectrum analyzer to obtain the intensity of the emission peak of F radical or C$^+$ ion.

The waveform analyzer 12 compares a change in waveform of the emission spectrum measured by the emission spectrometer 11 with a predetermined threshold, thereby detecting that the passivation layer 34 on the bottom of the trench 33 is completely removed so that the Si layer of the wafer 3 can be exposed to the bottom of the trench 33. The waveform analyzer 12 outputs a trigger signal upon detection of completion of the removal of the passivation layer 34 on the bottom of the trench 33. A method for detecting that the passivation layer 34 on the bottom of the trench 33 is completely removed is described in details below.

FIG. 3A is a cross-sectional view illustrating the passivation step performed when two trenches 33a, 33b having different widths are simultaneously formed. FIG. 3B is a cross-sectional view illustrating the etching step performed when the trenches 33a, 33b are simultaneously formed. As can be seen from FIGS. 3A and 3B, the width of the second trench 33b is larger than the width of the first trench 33a. Therefore, plasma for forming the passivation layer 34 can enter the second trench 33b more easily than the first trench 33a. Accordingly, as can be seen from FIG. 3A, the thickness of the passivation layer 34 formed in the second trench 33b becomes larger than the thickness of the passivation layer 34 formed in the first trench 33a. Therefore, the removal of the passivation layer 34 in the first trench 33a is completed before the removal of the passivation layer 34 in the second trench 33b is completed. The Si-etching to the bottom of the first trench 33a is started at the same time as the passivation layer 34 on the bottom of the first trench 33a is removed. As mentioned above, the intensity of the emission peak derived from F radical or C$^+$ ion changes upon completion of removal of the passivation layer 34 on the bottom of the first trench 33a. Therefore, the start of the Si-etching to the bottom of the first trench 33a can be detected by detecting the change in the emission intensity. For example, it can be determined that the Si-etching to the bottom of the first trench 33a is started when the change in the emission intensity exceeds a predetermined threshold.

In response to the trigger signal outputted from the waveform analyzer 12, the function generator 13 outputs a signal that causes the bias RF power source 9 to output a voltage that is smaller than a voltage outputted from the bias RF power source 9 before the waveform analyzer 12 outputs the trigger signal. For example, the function generator 13 outputs a signal S1 shown in FIG. 1. The signal S1 rises upon start of the etching step and steps down to one lower level upon input of the trigger signal into the function generator 13. The signal S1 outputted from the function generator 13 is combined with a signal S2 outputted from the process controller 10 to form a signal S3, for example, by a waveform synthesizer (not shown). The signal S3 is inputted to an input control terminal of the bias RF power source 9 so that an output voltage of the bias RF power source 9 can be reduced.

The etching apparatus 1 is controlled in the above manner to simultaneously form the first and second trenches 33a, 33b having different widths in the wafer 3. Next, a concrete example of the etching process performed by using the etching apparatus 1 is discussed below.

Firstly, an etching process for forming the trench 33 having a large aspect ratio is discussed below.

In the etching process, as mentioned previously, the passivation step and the etching step are alternately and repeatedly performed. As shown in FIGS. 2A-2C, the passivation step is performed by using C4F8 plasma, and the etching step is performed by using SF6 plasma. Specifically, the etching step includes a passivation layer removal sub-step shown in FIG. 2B, and a Si-etching sub-step shown in FIG. 2C. In the passivation layer removal sub-step, the passivation layer 34 on the bottom of the trench 33 is removed by sputtering effect of incident ion energy, so that the Si layer of the wafer 3 can be exposed to the bottom of the trench 33. In the Si-etching sub-step, the Si layer exposed to the bottom of the trench 33 is removed by reactive ion etching (RIE) reaction to increase the depth of the trench 33.

Figure 4A:
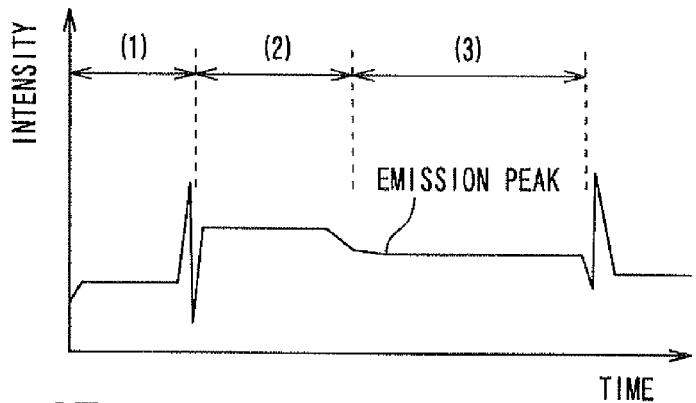
FIG. 4A is a diagram illustrating a change in an intensity of an emission peak derived from F radical.
Figure 4B:
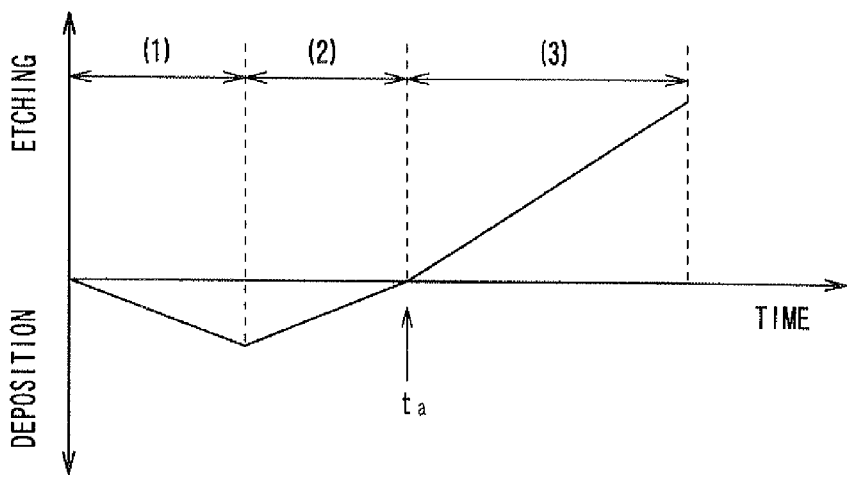
FIG. 4B is a diagram illustrating a change in an amount of deposition of a passivation layer on a bottom of the trench and illustrating a change in the amount of a Si layer removed at the bottom of the trench.
Figure 4C:
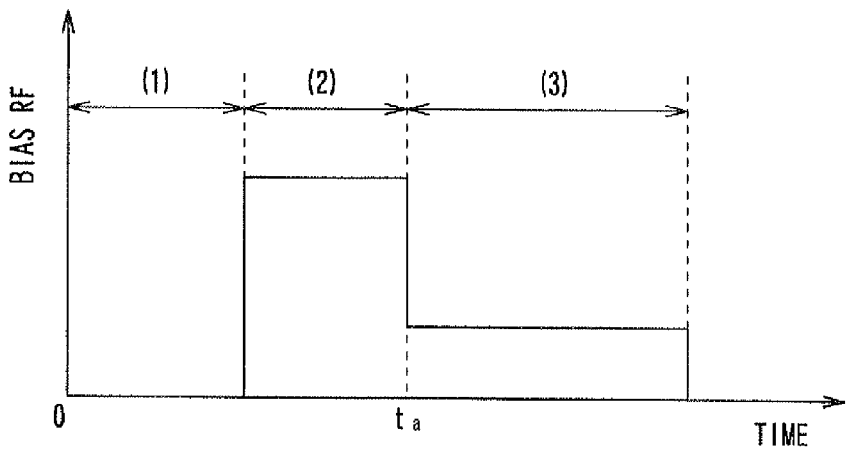
FIG. 4C is a diagram illustrating a change in a bias RF power.

The intensity of the emission peak derived from F radical or $C^+$ ion changes at the time of switching from the passivation layer removal sub-step to the Si-etching sub-step. Therefore, the switching from the passivation layer removal sub-step to the Si-etching sub-step can be detected by analyzing the plasma emission spectrum. FIG. 4A is a diagram illustrating a change in the intensity of the emission peak derived from F radical. FIG. 4B is a diagram illustrating a change in the deposition amount and a change in the etching amount. The deposition amount represents the amount of deposition of the passivation layer 34 on the bottom of the trench 33. In other words, the deposition amount represents the thickness of the passivation layer 34 formed on the bottom of the trench 33. The etching amount is the amount of the Si layer removed at the bottom of the trench 33 to increase the depth of the trench 33. FIG. 4C is a diagram illustrating a change in the bias RF power of the bias RF power source 9. Throughout the drawings including FIGS. 2A-2C and 4A-4C, (1) represents the passivation step, (2) represents the passivation layer removal sub-step of the etching step, and (3) represents the Si-etching sub-step of the etching step.

As shown in FIG. 4B, when the etching step is started after the passivation layer 34 is formed on the bottom of the trench 33 in the passivation step, the passivation layer 34 is gradually removed. Then, when the passivation layer 34 is completely removed, the Si-etching for removing the Si layer at the bottom of the trench 33 is started.

As shown in FIG. 4A, the intensity of the emission peak derived from F radical steps down to one lower level during the etching step. Specifically, the intensity of the emission peak derived from F radical steps down at a time ta indicated by an arrow in FIG. 4B. The time Ta represents a time when the etching step switches from the passivation layer removal sub-step to the Si-etching sub-step. That is, the removal of the passivation layer 34 on the bottom of the trench 33 is completed at the time Ta. Therefore, the time Ta, when the etching step switches from the passivation layer removal sub-step to the Si-etching sub-step, can be detected based on the change in the intensity of the emission peak derived from F radical.

In addition to the time ta, the emission intensity may change at a first time of switching from the passivation step to the etching step and at a second time of switching from the etching step to the next passivation step, for example, due to the exchange of gas in the etching chamber 2 and the change in pressure in the etching chamber 2. It is noted that the first time and the second time are detected by the process controller 10 so that the time ta can be distinguished from the first time and the second time.

It is noted that the intensity of the emission peak derived from $C^+$ ion changes in the same manner as the intensity of the emission peak derived from F radical. Therefore, the switch from the passivation layer removal sub-step to the Si-etching sub-step can be detected based on the change in the intensity of the emission peak derived from $C^+$ ion.

In the passivation layer removal sub-step, the polymer-type passivation layer 34 is removed physically by energy of incident ion collisions. Since the energy of incident ion collisions depends strongly on the bias RF power, the passivation layer 34 cannot be removed if the bias RF power is less than a certain threshold level. In contrast, in the Si-etching sub-step subsequent to the passivation layer removal sub-step, the Si layer at the bottom of the trench 33 is chemically removed by RIE reaction between the incident ion and F radical. Since the reactivity between F radical and Si is very high, the Si-etching can progress without the ion collision energy.

Figure 5:
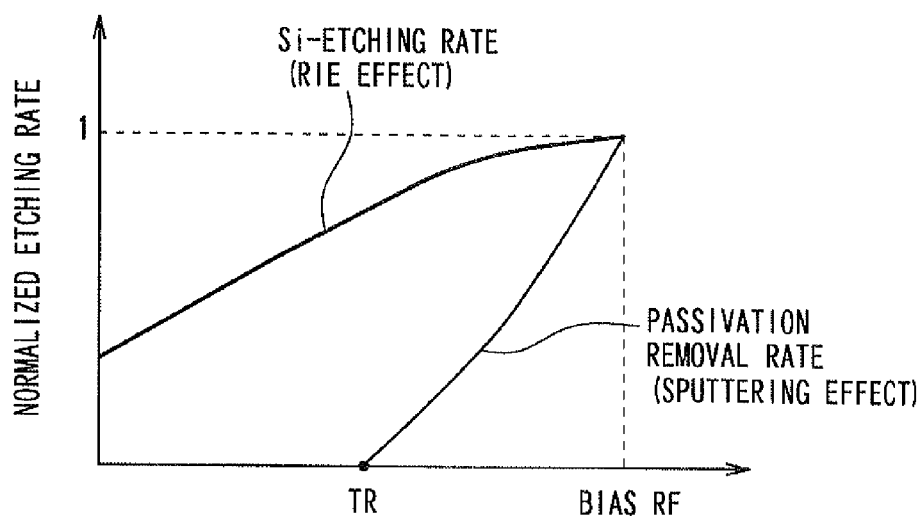
FIG. 5 is a diagram illustrating a relationship between the bias RF power and a normalized etching rate.

FIG. 5 is a diagram illustrating a relationship between the bias RF power and a normalized etching rate. As can be seen from FIG. 5, since the removal of the passivation layer 34 on the bottom of the trench 33 is achieved by the sputtering effect, the removal of the passivation layer 34 is not performed until the bias RF power exceeds a removal threshold TR. When the bias RF power exceeds the removal threshold TR, the removal of the passivation layer 34 is performed. A removal rate at which the removal of the passivation layer 34 is performed increases with an increase in the bias RF power. In contrast, since the Si-etching of the trench 33 is performed by the reaction between F radical and Si, the Si-etching can be performed regardless of whether the bias RF power exceeds the removal threshold TR. Like the removal rate, a Si-etching rate at which the Si-etching is performed increases with the increase in the bias RF power.

Thus, when the bias RF power is reduced below the removal threshold TR, the Si-etching of the trench 33 is performed while preventing the passivation layer 34 from being removed. Further, since a rate of decrease in the Si-etching rate is small, the Si-etching of the trench 33 can be suitably performed when the bias RF power is reduced below the removal threshold TR. Therefore, the removal of the passivation layer 34 and the Si-etching of the trench 33 can be performed independently by varying the bias RF power between the passivation layer removal sub-step and the Si-etching sub-step as shown in FIG. 4C.

In the discussion below with reference to FIGS. 3A and 3B, the trenches 33a, 33b having different widths are formed by the above described method.

As mentioned previously, the width of the first trench 33a is less than the width of the second trench 33b, and the passivation layer 34 is deposited by a CVD method. Therefore, in the passivation step, the thickness of the passivation layer 34 formed on the bottom of the second trench 33b becomes greater than the thickness of the passivation layer 34 formed on the bottom of the first trench 33a. In contrast, in the passivation layer removal sub-step of the etching step, the passivation layer 34 is removed at the same removal rate between the first trench 33a and the second trench 33b, because the passivation layer 34 is removed by an ion sputtering method.

Therefore, the removal of the passivation layer 34 on the bottom of the first trench 33a is completed before the removal of the passivation layer 34 on the bottom of the second trench 33b is completed. Accordingly, the Si-etching of the first trench 33a is started before the Si-etching of the second trench 33b is started. The bias RF power is reduced below the removal threshold TR upon completion of the removable of the passivation layer 34 on the bottom of the first trench 33a. A completion time (i.e., to in FIG. 4B), when the removable of the passivation layer 34 on the bottom of the first trench 33a is completed, is detected by emission spectroscopy as mentioned previously. The passivation layer 34 remains on the bottom of the second trench 33b at the completion time. The remaining passivation layer 34 on the bottom of the second trench 33b is not removed due to the reduction in the bias RF power below the removal threshold TR. Therefore, the Si-etching of the second trench 33b is not started. As a result, as shown in FIG. 3B, the Si layer at the bottom of only the first trench 33a is removed so that the depth of only the first trench 33a can be increased.

A phenomenon shown in FIG. 3B is a reverse RIE-lag. The above etching process for causing the reverse RIE-lag by controlling the bias RF power is hereinafter called the "reverse RIE-lag etching process". In contrast, a normal etching process in which the bias RF power is not controlled is hereinafter called the "normal etching process". A normal RIE-lag can be prevented by combining the reverse RIE-lag etching process and the normal etching process at a predetermined time ratio. Further, by adjusting the time ratio between the reverse RIE-lag etching process and the normal etching process, the depths of the first trench 33a and the second trench 33b can be controlled independently. Thus, the depth of the first trench 33a can be made equal to, less than, or greater than the depth of the second trench 33b.

Based on the above study, the etching process according to the first embodiment is performed. FIGS. 6A-6D are timing charts of the etching process according to the first embodiment. The etching process according to the first embodiment is described below with reference to FIGS. 6A-6D.

Firstly, the wafer 3 is prepared. It is noted that the mask 32 having the opening 31 is on a front side of the wafer 3. Then, the back side of the wafer 3 is placed on the electrode 2b of the base 2a of the etching chamber 2.

Figure 6A:
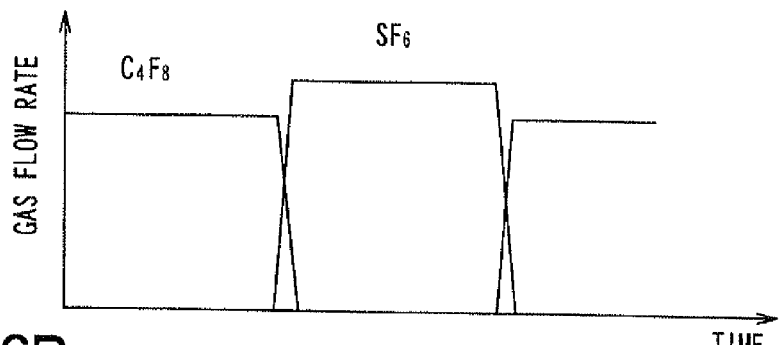
FIG. 6A is a timing chart illustrating a gas flow rate during the etching process.
Figure 6B:
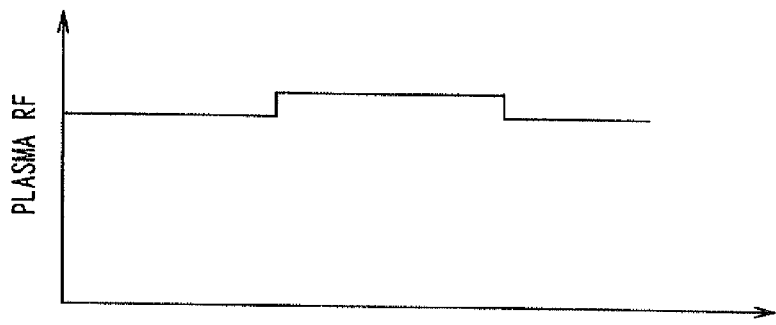
FIG. 6B is a timing chart illustrating a plasma RF during the etching process.
Figure 6C:
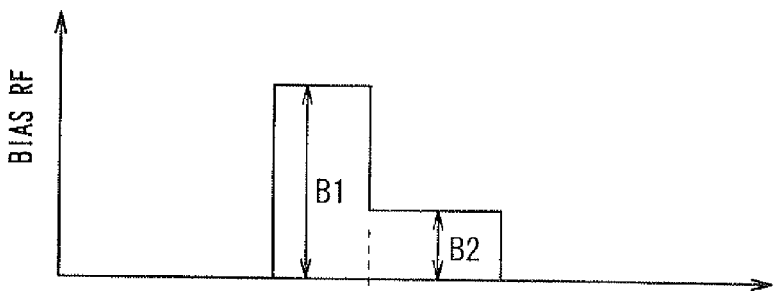
FIG. 6C is a timing chart illustrating the bias RF during the etching process.
Figure 6D:
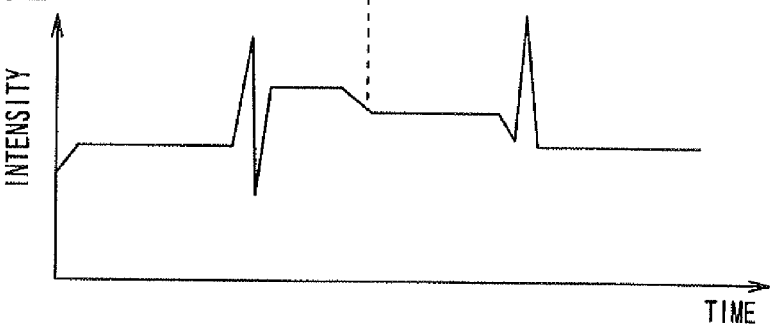
FIG. 6D is a timing chart illustrating an emission intensity at the peak of F radical during the etching process.

Then, the passivation step is performed. In the passivation step, as shown in FIGS. 6A and 6B, C4F8 gas is introduced into the etching chamber 2 by adjusting the flow rate of C4F8 gas using the first and second MFCs 4a and 4b, while adjusting the RF power of the plasma RF power source 8 to a first value necessary to form the passivation layer 34. Further, the gas in the etching chamber 2 is removed through the outlet port 6 using a vacuum pump so that the degree of vacuum in the etching chamber 2 can be adjusted to a predetermined value by equilibrium state between the introduced gas amount and the removed gas amount. Thus, C4F8 gas is converted into plasma, and CFx* is produced so that the passivation layer 34 can be formed. The passivation step is continued for a predetermined period of time so that the passivation layer 34 can have a predetermined thickness. It is noted that since, the width of the opening 31 corresponding to the second trench 33b is less than the width of the opening 31 corresponding to the first trench 33a, the thickness of the passivation layer 34 formed on the bottom of the first trench 33a becomes less than the thickness of the passivation layer 34 formed on the bottom of the second trench 33b.

Then, the type of gas introduced into the etching chamber 2 is changed by adjusting the gas flow rate using the first and second MFCs 4a and 4b so that SF6 gas can be introduced into the etching chamber 2. Further, at the same time, the RF power of the plasma RF power source 8 is set to a second value necessary for the etching step, and the RF power of the bias RF power source 9 is set to a setting value B1 that is greater than the removal threshold TR. Thus, SF6 gas is converted into plasma so that SFx+ can be produced. In this way, the passivation layer removal sub-step of the etching step is performed so that the passivation layer 34 on the bottoms of the first and second trenches 33a and 33b can be removed.

During the passivation layer removal sub-step, the intensity of the emission peak derived from F radical is monitored to detect that the emission intensity decreases below a predetermined threshold. The fact that the emission intensity decreases below the predetermined threshold indicates that although the passivation layer 34 on the bottom of the first trench 33a is completely removed, the passivation layer 34 on the bottom of the second trench 33b remains. Upon detection that the emission intensity decreases below the predetermined threshold, the RF power of the bias RF power source 9 is reduced to a setting value B2 that is less than the removal threshold TR. Since the bias RF power is less than the removal threshold TR, the passivation layer 34 on the bottom of the second trench 33b cannot be removed any more. In this way, the Si-etching sub-step of the etching step is performed so that the Si layer at the bottom of only the first trench 33a can be removed. As a result, the depth of only the first trench 33a is increased.

After the Si-etching sub-step of the etching step is continued for a predetermined period of time, the etching process returns to the passivation step by changing the type of gas introduced into the etching chamber 2, by setting the RF power of the plasma RF power source 8 to the first value necessary to form the passivation layer 34, and by setting the RF power of the bias RF power source 9 to zero. During the etching process, the passivation step and the etching step are alternately and repeatedly performed every predetermined period of time. Thus, the depth of the first trench 33a is increased prior to the depth of the second trench 33b so that the reverse RIE-lag can be caused.

FIG. 7A is a diagram illustrating the first and second trenches 33a and 33b formed by the reverse RIE-lag etching process in which the bias RF power is controlled. FIG. 7B is a diagram illustrating the first and second trenches 33a and 33b formed by the normal etching process in which the bias RF power is not controlled. In an example shown in FIGS. 7A and 7B, the width of the first trench 33a is 0.5 micrometers (μm), and the width of the second trench 33b is 40 μm. It is noted that only a left half of the second trench 33b is shown in FIGS. 7A and 7B. As can be seen from FIG. 7B, when the first and second trenches 33a and 33b are formed by the normal etching process, the normal RIE-lag occurs so that the depth of the second trench 33b can become greater than the depth of the first trench 33a. In contrast, as can be seen from FIG. 7A, when the first and second trenches 33a and 33b are formed by the reverse RIE-lag etching process, the reverse RIE-lag is caused so that the depth of only the first trench 33a can be increased without increasing the depth of the second trench 33b.

As described above, according to the first embodiment, although the first trench 33a is narrower than the second trench 33b, the first trench 33a can be deeper than the second trench 33b by causing the reverse RIE-lag. Further, according to the first embodiment, the reverse RIE-lag is caused based on the fact that the thickness of the passivation layer 34 formed on the trench 33 depends on the width of the trench 33. That is, the reverse RIE-lag can be caused by only one type of passivation layer.

Therefore, even when the trench 33 has a high aspect ratio, the trench 33 can be formed while preventing silicon needles (i.e., so-called "Black silicon"). Further, since there is no need to form two different types of passivation layers, an increase in the manufacturing time can be prevented. Thus, the depths of the trenches 33 having different widths can be controlled independently without the increase in the manufacturing time.

Specifically, the normal RIE-lag can be prevented by combining the reverse RIE-lag etching process and the normal etching process at a predetermined time ratio. Further, by adjusting the time ratio between the reverse RIE-lag etching process and the normal etching process, the depths of the first trench 33a and the second trench 33b can be controlled independently. Thus, the depth of the first trench 33a can be made equal to, less than, or greater than the depth of the second trench 33b, despite the fact that the width of the first trench 33a is less than the width of the second trench 33b.

In a conventional technique, the bias RF power is increased only at the initial stage of the etching step. However, the passivation layer is formed by a CVD, the thickness of the passivation layer formed on the bottom of the trench depends on the aspect ratio of the trench. That is, as the depth of the trench increases (i.e., as the etching progresses, the thickness of the passivation layer formed on the bottom of the trench decreases. Further, as the width of the trench is smaller (i.e., as the aspect ratio of the trench is higher), the thickness of the passivation layer formed on the bottom of the trench is smaller. Therefore, the time required to remove the passivation layer on the bottom of the trench can vary depending on the aspect ratio of the trench.

In the conventional technique, the period where the bias RF power is increased is fixed (i.e., only at the initial stage of the etching step) without taking into considerations the etching progress and the width difference. Therefore, the conventional technique has only a limited effect on preventing the normal RIE-lag.

In contrast, in the method according to the first embodiment, the bias RF power is feedback-controlled by monitoring the plasma light emission. In such an approach, the bias RF power can be accurately controlled based on when the passivation layer on the bottom of the trench is removed. Therefore, the reverse RIE-lag can be caused for any trench pattern so that the normal RIE-lag can be prevented.

Second Embodiment

A second embodiment of the present invention is described below with reference to FIGS. 8 and 9. A difference between the first and second embodiments is as follows.

According to the second embodiment, the passivation layer 34 remaining on the bottom of the second trench 33b is removed during the etching of the first trench 33a so as to prevent the passivation layer 34 on the bottom of the second trench 33b from becoming too thick due to repetitions of the etching processes. This can be achieved based on the relationship between the bias RF power of the bias RF power source 9 and the etching rate.

Figure 8:
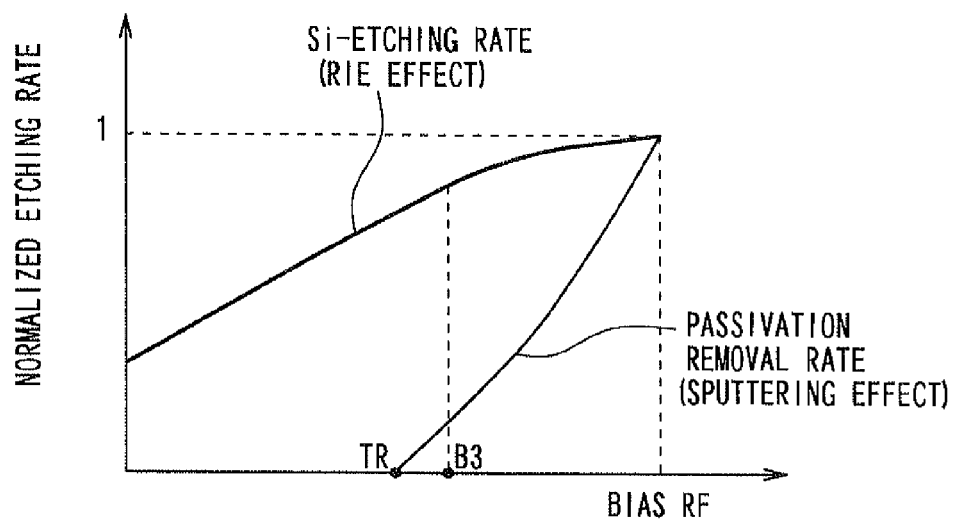
FIG. 8 is a diagram illustrating a relationship between a bias RF power, a normalized etching rate, and a setting value according to a second embodiment of the present invention.

FIG. 8 is a diagram illustrating a relationship between the bias RF power, the normalized etching rate, and a bias RF power setting value according to the second embodiment of the present invention. The relationship between the bias RF power and the normalized etching rate shown in FIG. 8 is the same as that shown in FIG. 5.

As shown in FIG. 8, when the bias RF power is less than the removal threshold TR, the removal of the passivation layer 34 is not performed. In contrast, even when the bias RF power is less than the removal threshold TR, the Si-etching is performed.

According to the first embodiment, the bias RF power is set below the removal threshold TR during the Si-etching substep. In such an approach, the first trench 33a can be etched while preventing the passivation layer 34 on the bottom of the second trench 33b from being removed.

In contrast, according to the second embodiment, the bias RF power is set to a setting value B3 greater than the removal threshold TR during the Si-etching sub-step. In such an approach, the first trench 33a is etched while allowing the passivation layer 34 on the bottom of the second trench 33b to be removed. As the setting value B3 is closer to the removal threshold TR, the removal rate at which the passivation layer 34 on the bottom of the second trench 33b is removed becomes smaller. According to the second embodiment, the setting value B3 is set to a level that prevents the passivation layer 34 on the bottom of the second trench 33b from being completely removed within the remaining time of the present etching step.

Figure 9:
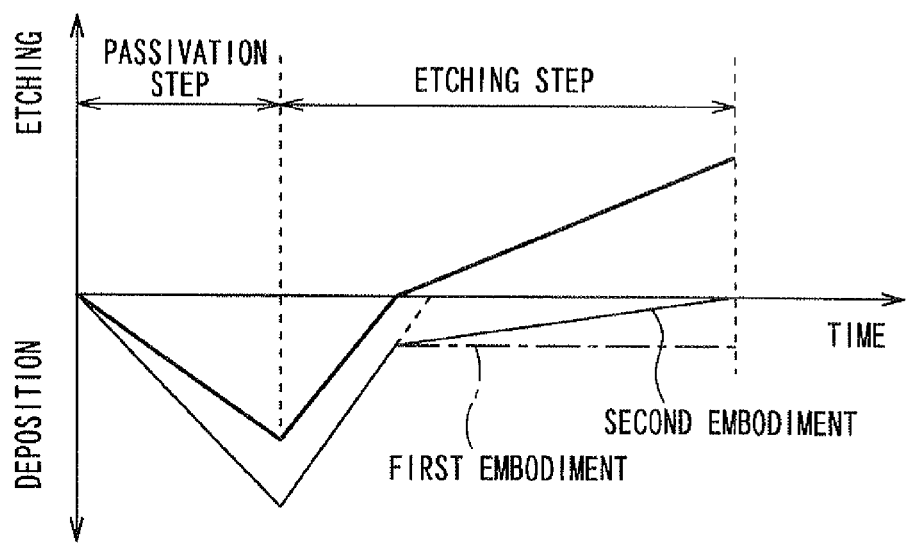
FIG. 9 is a diagram illustrating a change in an amount of deposition of a passivation layer on a bottom of first and second trenches and illustrating a change in the amount of a Si layer removed at the bottom of the first and second trenches according to the second embodiment.

FIG. 9 is a diagram illustrating the etching amount and the deposition amount at the bottoms of the first and the second trenches 33a and 33b formed by the etching process according to the second embodiment. As can be seen from FIG. 9, when the etching step is started after the passivation layer 34 is deposited on the bottoms of the trenches 33a and 33b in the passivation step, the passivation layer 34 is gradually removed. Since the thickness of the passivation layer 34 on the bottom of the first trench 33a is less than the thickness of the passivation layer 34 on the bottom of the second trench 33b, the passivation layer 34 on the bottom of the first trench 33a is completely removed before the passivation layer 34 on the bottom of the second trench 33b is completely removed. The Si-etching sub-step is started upon completion of the removal of the passivation layer 34 on the bottom of the first trench 33a.

The bias RF power is reduced to the setting value B3 upon start of the Si-etching sub-step. The setting value B3 has a level that prevents the passivation layer 34 on the bottom of the second trench 33b from being completely removed within the remaining time of the present etching step. Therefore, as shown in FIG. 9, the passivation layer 34 on the bottom of the second trench 33b is not completely removed when the present etching step is completed.

As describe above, according to the second embodiment, the bias RF power is set to the setting value B3 greater than the removal threshold TR during the Si-etching sub-step. In such an approach, the first trench 33a is etched while allowing the passivation layer 34 on the bottom of the second trench 33b to be removed. Thus, it is possible to prevent the passivation layer 34 on the bottom of the second trench 33b from being too thick due to repetitions of the etching processes. Further, since the setting value B3 has a level that prevents the passivation layer 34 on the bottom of the second trench 33b from being completely removed within the remaining time of the present etching step, the same effect as the first embodiment can be obtained.

Third Embodiment

A third embodiment of the present invention is described below with reference to FIGS. 10 and 11. A difference between the second and third embodiments is as follows.

According to the third embodiment, not only the removal of the passivation layer 34 on the bottom of the second trench 33b but also the etching of the second trench 33b is performed during the etching of the first trench 33a. This can be achieved based on the relationship between the bias RF power of the bias RF power source 9 and the etching rate.

Figure 10:
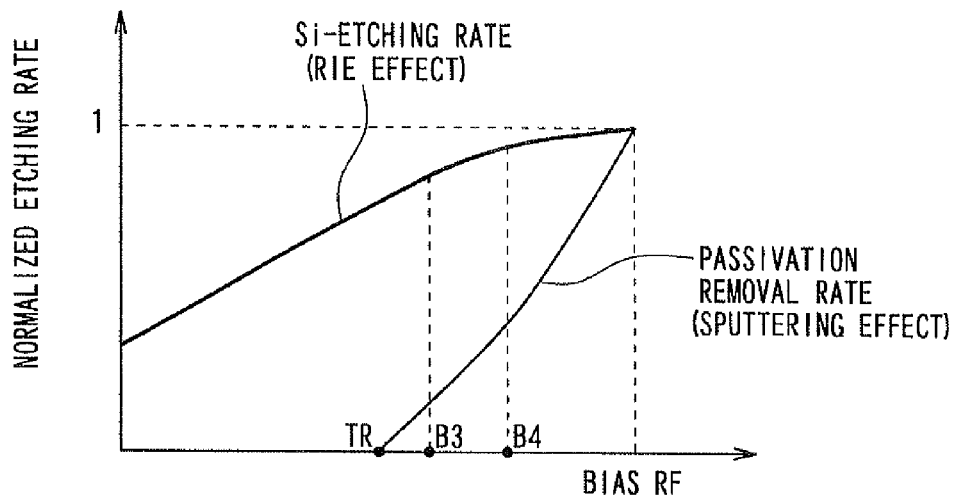
FIG. 10 is a diagram illustrating a relationship between a bias RF power, a normalized etching rate, and a setting value according to a third embodiment of the present invention.

FIG. 10 is a diagram illustrating a relationship between the bias RF power, the normalized etching rate, and a bias RF power setting value according to the third embodiment of the present invention. The relationship between the bias RF power and the normalized etching rate shown in FIG. 10 is the same as that shown in FIG. 5.

As can be seen from FIG. 10, the removal rate increases with an increase in the bias RF power in the range exceeding the removal threshold TR. According to the third embodiment, the bias RF power is set to a setting value B4 greater than the removal threshold TR during the Si-etching sub-step. In such an approach, the first trench 33a is etched while allowing the passivation layer 34 on the bottom of the second trench 33b to be removed. Specifically, the setting value B4 has a level that allows the passivation layer 34 on the bottom of the second trench 33b from being completely removed within the present etching step. When the passivation layer 34 on the bottom of the second trench 33b is completely removed within the present etching step, the Si-etching of the second trench 33b can progress during the remaining time of the present etching step. Further, since the second trench 33b is wider than the first trench 33a, the etching rate at the bottom of the second trench 33b is greater than the etching rate at the bottom of the first trench 33a. Therefore, the etching amount of the Si layer at the bottom of the second trench 33b can be made equal to the etching amount of the Si layer at the bottom of the first trench 33a at the end of the present etching step by adjusting the bias RF power.

Figure 11:
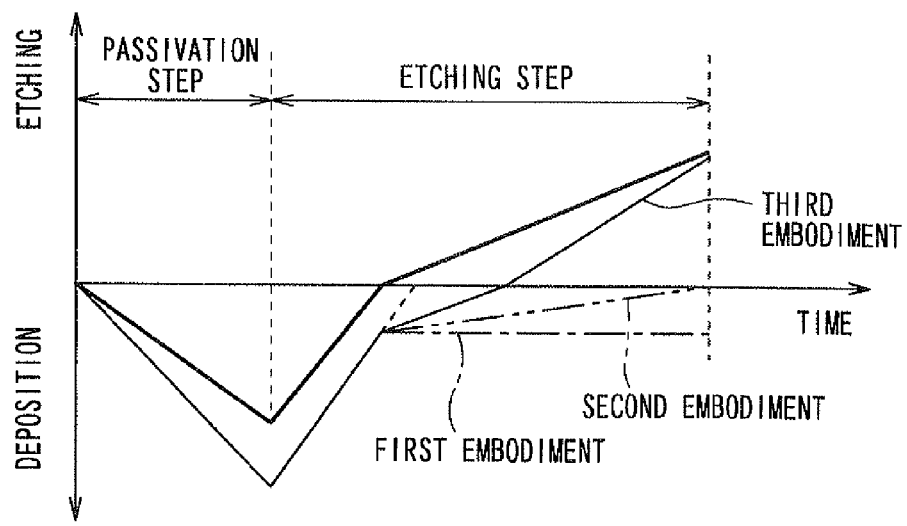
FIG. 11 is a diagram illustrating a change in an amount of deposition of a passivation layer on a bottom of first and second trenches and illustrating a change in the amount of a Si layer removed at the bottom of the first and second trenches according to the third embodiment.

FIG. 11 is a diagram illustrating the etching amount and the deposition amount at the bottoms of the first and the second trenches 33a and 33b formed by the etching process according to the third embodiment. As can be seen from FIG. 11, when the etching step is started after the passivation layer 34 is deposited on the bottoms of the trenches 33a and 33b in the passivation step, the passivation layer 34 is gradually removed. Since the thickness of the passivation layer 34 on the bottom of the first trench 33a is less than the thickness of the passivation layer 34 on the bottom of the second trench 33b, the passivation layer 34 on the bottom of the first trench 33a is completely removed before the passivation layer 34 on the bottom of the second trench 33b is completely removed. The Si-etching of the first trench 33a is started upon completion of the removal of the passivation layer 34 on the bottom of the first trench 33a. Then, after a predetermined lapse of time from start of the Si-etching of the first trench 33a, the passivation layer 34 on the bottom of the second trench 33b is completely removed so that the Si-etching of the second trench 33b can be started.

As mentioned above, the etching rate at the bottom of the second trench 33b is greater than the etching rate at the bottom of the first trench 33a. Therefore, a difference between the etching amount of the first trench 33a and the etching amount of the second trench 33b is gradually reduced. Therefore, the etching amount of the second trench 33b can be made equal to the etching amount of the first trench 33a at the end of the present etching step by adjusting the bias RF power.

As describe above, according to the third embodiment, the bias RF power is set to the setting value B4 greater than the removal threshold TR during the Si-etching sub-step. In such an approach, the first trench 33a is etched while allowing the passivation layer 34 on the bottom of the second trench 33b to be removed. Further, since the setting value B4 has a level that allows the passivation layer 34 on the bottom of the second trench 33b from being completely removed within the present etching step, the first and second trenches 33a and 33b can be etched at the same time.

Fourth Embodiment

A fourth embodiment of the present invention is described below. A difference between the fourth embodiment and the preceding embodiments is as follows.

In the preceding embodiments, the etching process is repeated. Therefore, there is a possibility that the passivation layer 34 on the bottom of the second trench 33b becomes too thick due to repetitions of the etching processes. It may be difficult to remove the too thick passivation layer 34 later.

To prevent such a problem, according to the fourth embodiment, a passivation layer removal step for removing the passivation layer 34 is performed, for example, every several to several dozens of repetitions of the etching processes. In such an approach, it is possible to prevent the thick passivation layer 34 from becoming too thick. For example, in the passivation layer removal step, oxygen gas is introduced into the etching chamber 2 to induce oxygen plasma, and the oxygen plasma is applied to the wafer 3 so that the polymer passivation layer 34 can be decomposed.

Fifth Embodiment

A fifth embodiment of the present invention is described below with reference to FIGS. 12A and 12B, and 13A and 13B. A difference between the fifth embodiment and the preceding embodiments is as follows.

Figure 13A:
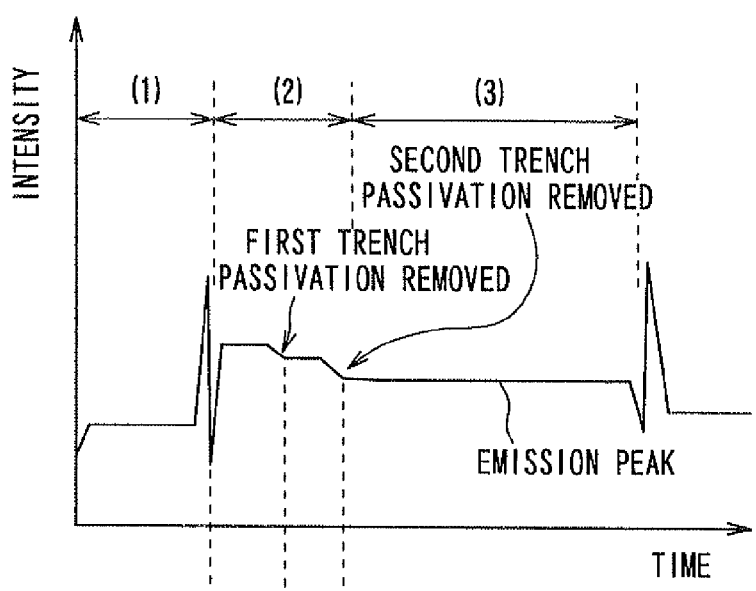
FIG. 13A is a diagram illustrating a change in an intensity of an emission peak derived from F radical when the three trenches are simultaneously formed.
Figure 13B:
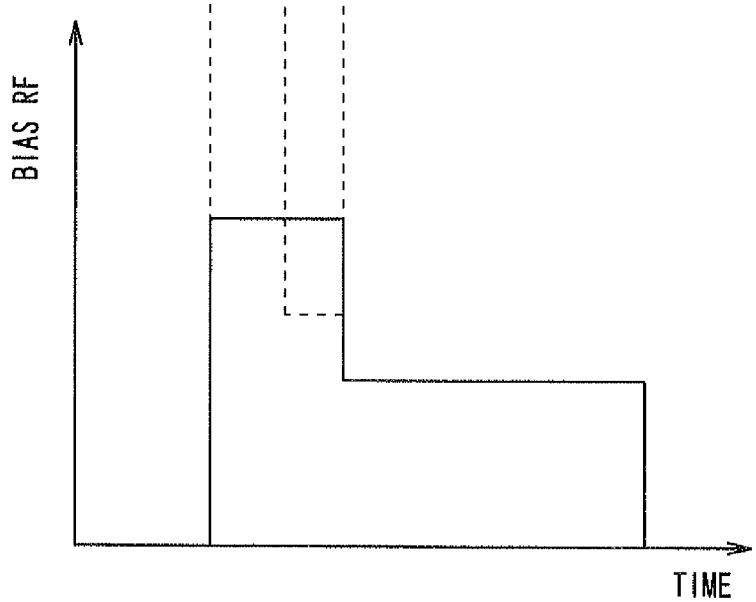
FIG. 13B is a diagram illustrating a change in a bias RF power when the three trenches are simultaneously formed.

FIG. 12A is a cross-sectional view illustrating the passivation step performed when three trenches 33a, 33b, and 33c having different widths are simultaneously formed. FIG. 12B is a cross-sectional view illustrating the etching step performed when the trenches 33a, 33b, and 33c are simultaneously formed. FIG. 13A is a diagram illustrating a change in the intensity of the emission peak derived from, F radical when the trenches 33a, 33b, and 33c are simultaneously formed. FIG. 13B is a diagram illustrating a change in the bias RF power when the trenches 33a, 33b, and 33c are simultaneously formed.

As can be seen from FIGS. 12A and 12B, the width of the second trench 33b is larger than the width of the first trench 33a, and the width of the third trench 33c is larger than the width of the second trench 33b. Therefore, the thickness of the passivation layer 34 formed in the second trench 33b becomes larger than the thickness of the passivation layer 34 formed in the first trench 33a, and the thickness of the passivation layer 34 formed in the third trench 33c becomes larger than the thickness of the passivation layer 34 formed in the second trench 33b. Therefore, the removal of the passivation layer 34 in the first trench 33a is completed before the removal of the passivation layer 34 in the second trench 33b is completed, and the removal of the passivation layer 34 in the second trench 33b is completed before the removal of the passivation layer 34 in the third trench 33c is completed. The intensity of the emission peak derived from F radical (or $C^+$ ion) steps down for the first time after the start of the etching step, when the passivation layer 34 on the bottom of the first trench 33a is completely removed. Then, the intensity of the emission peak derived from F radical (or $C^+$ ion) steps down for the second time after the start of the etching step, when the passivation layer 34 on the bottom of the second trench 33b is completely removed.

For example, if the bias RF power is reduced below the removal threshold TR when the intensity of the emission peak steps down for the second time, the first trench 33a and the second trench 33b are etched while preventing the third trench 33c from being etched, as shown in FIG. 12B. In contrast, as indicated by a broken line in FIG. 13B, if the bias RF power is reduced below the removal threshold TR when the intensity of the emission peak steps down for the first time, the first trench 33a is etched while preventing the second trench 33b and the third trench 33c from being etched. Thus, the reverse RIE-lag can be caused between the first trench 33a and the second trench 33b or between the second trench 33b and the third trench 33c by controlling when the bias RF power is reduced below the removal threshold TR.

Therefore, the normal RIE-lag can be prevented by combining the reverse RIE-lag etching process and the normal etching process at a predetermined time ratio. Further, by adjusting the time ratio between the reverse RIE-lag etching process and the normal etching process, the depths of the first trench 33a, the second trench 33b, and the third trench 33c can be controlled independently. Thus, the first trench 33a, the second trench 33b, and the third trench 33c can have the same depth or different depths.

Sixth Embodiment

Figure 14A:
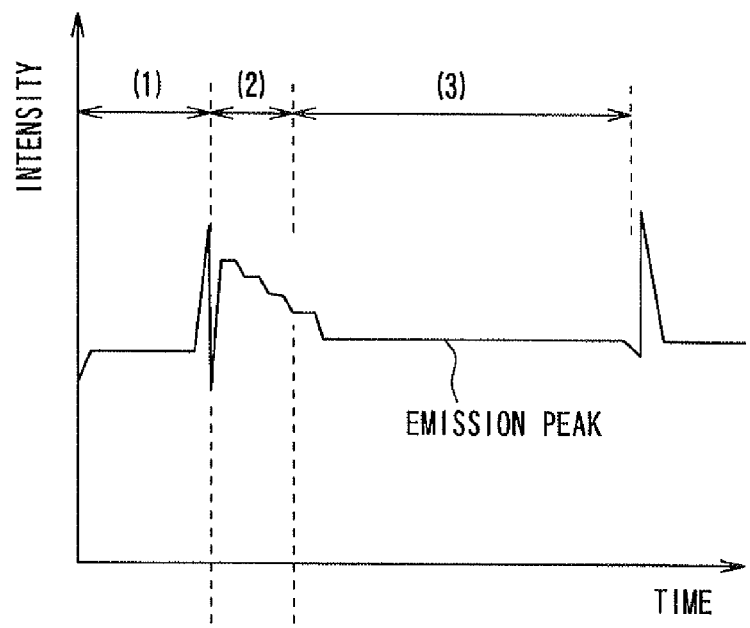
FIG. 14A is a diagram illustrating a change in an intensity of an emission peak derived from F radical when M trenches are simultaneously formed.
Figure 14B:
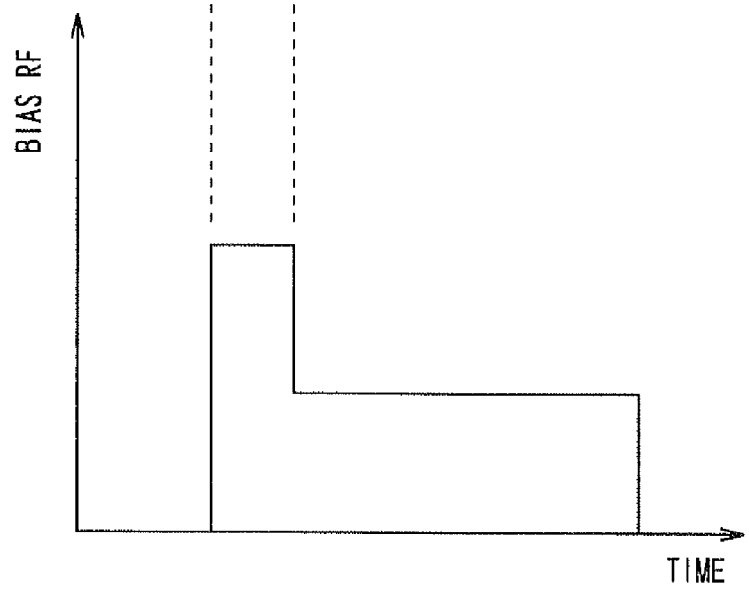
FIG. 14B is a diagram illustrating a change in a bias RF power when the M trenches are simultaneously formed.

A sixth embodiment of the present invention is described below with reference to FIGS. 14A and 14B. A difference between the sixth embodiment and the preceding embodiments is as follows.

FIG. 13A is a diagram illustrating a change in the intensity of the emission peak derived from F radical when M trenches 33 having different widths are simultaneously formed. FIG. 13B is a diagram illustrating a change in the bias RF power when the M trenches 33 are simultaneously formed. It is noted that "M" is a positive integer more than one.

The thickness of the passivation layer 34 formed in the trench 33 having the (N+1)th smallest width becomes larger than the thickness of the passivation layer 34 formed in the trench 33 having (N)th smallest width, where "N is a positive integer less than "M". As shown in FIG. 14A, when the M trenches 33 are simultaneously formed, the emission intensity slightly steps down each time when the passivation layer 34 on the bottom of one trench 33 is completely removed. Therefore, if the bias RF power is reduced below the removal threshold TR when the intensity of the emission peak steps down for the Nth time after the start of the etching step, the trench 33 having the width greater than the (N+1)th smallest width is not etched.

Thus, the reverse RIE-lag can be caused between the trench 33 having Nth smallest width and the trench 33 having (N+1)th smallest width. Therefore, the same effect as the fifth embodiment can be obtained by combining the reverse RIE-lag etching process and the normal etching process at a predetermined time ratio, even when there are M trenches 33 having different widths.

Figure 15A:
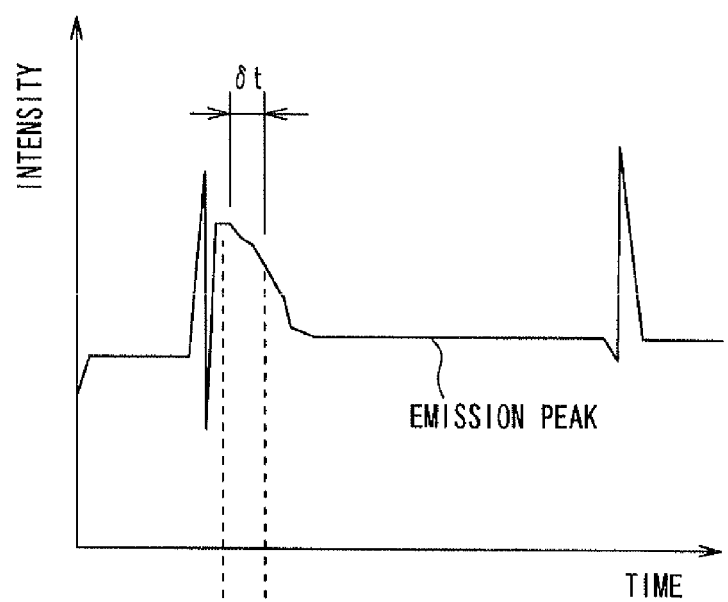
FIG. 15A is a diagram illustrating a practical change in an intensity of an emission peak derived from F radical when M trenches are simultaneously formed.

In practice, when M trenches 33 having different widths are simultaneously formed, the intensity of the emission peak derived from F radical may continuously change slightly as shown in FIG. 15A. If the change in the emission intensity may be detected as a smooth downward curve change not a step down change, it is difficult to accurately determine that the passivation layer 34 on the bottom of the trench 33 is completely removed.

Figure 15B:
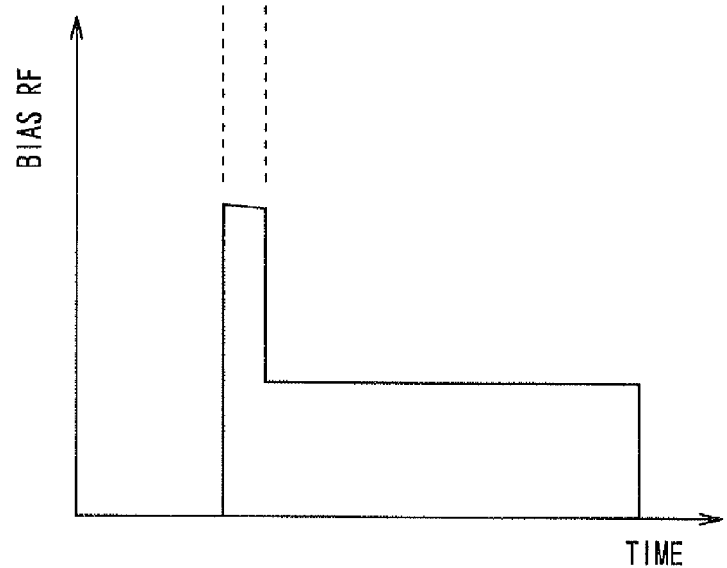
FIG. 15B is a diagram illustrating a practical change in a bias RF power when the M trenches are simultaneously formed.

In such a case, as shown in FIGS. 15A, and 15B, the bias RF power can be reduced below the removal threshold TR after a predetermined lapse time δt from when the emission intensity decreases for the first time after the start of the etching step. In other words, the bias RF power can be reduced below the removal threshold TR after the predetermined lapse time δt from when the passivation layer 34 on the bottom of the trench 33 having the smallest width is completely removed. For example, if the predetermined lapse time δt corresponds to a period of time from when the passivation layer 34 on the bottom of the trench 33 having the smallest width is completely removed to when the passivation layer 34 on the bottom of the trench 33 having the Nth smallest width is completely removed, the reverse RIE-lag can be caused between the trench 33 having Nth smallest width and the trench 33 having (N+1)th smallest width.

Seventh Embodiment

A seventh embodiment of the present invention is described below with reference to FIGS. 16A and 16B, and 17A and 17B. A difference between the seventh embodiment and the preceding embodiments is as follows.

In the preceding embodiments, there is no discussion on when the etching process switches from the etching step to the passivation step. In the seventh embodiment, the switch from the etching step to the passivation step is controlled. In the discussion below, the first embodiment is taken as an example. It is noted that the seventh embodiment can be applied to the second through sixth embodiments as well as the first embodiment.

Figure 16A:
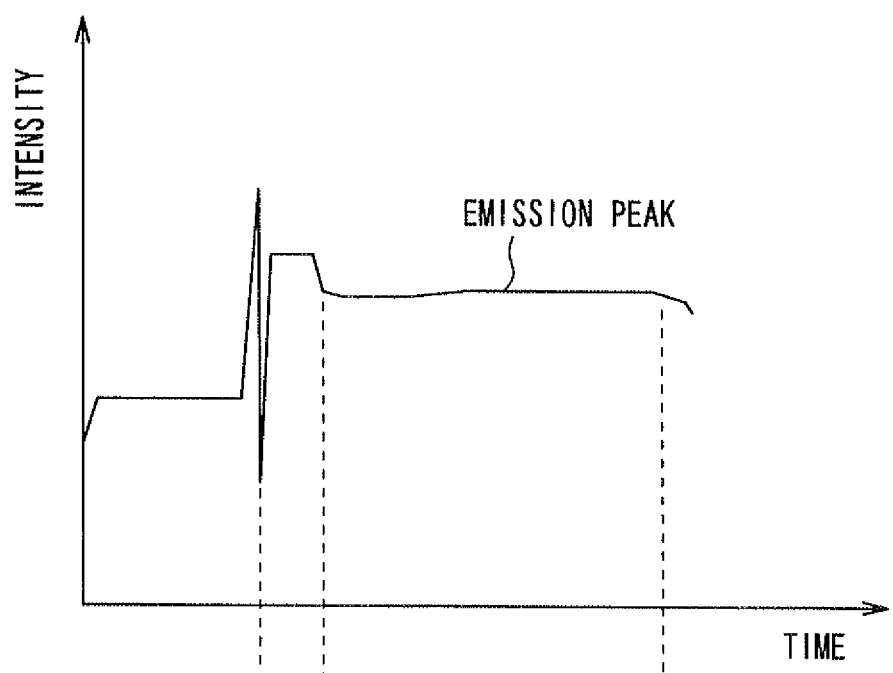
FIG. 16A is a diagram illustrating a change in an intensity of an emission peak derived from F radical when first and second trenches are simultaneously formed.
Figure 16B:
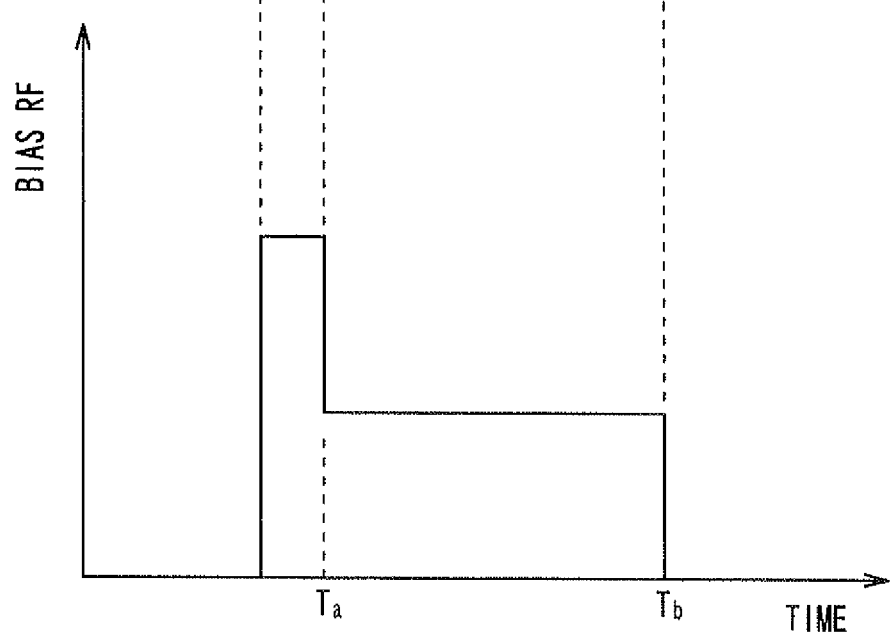
FIG. 16B is a diagram illustrating a change in a bias RF power when the first and second trenches are simultaneously formed.
Figure 17A:
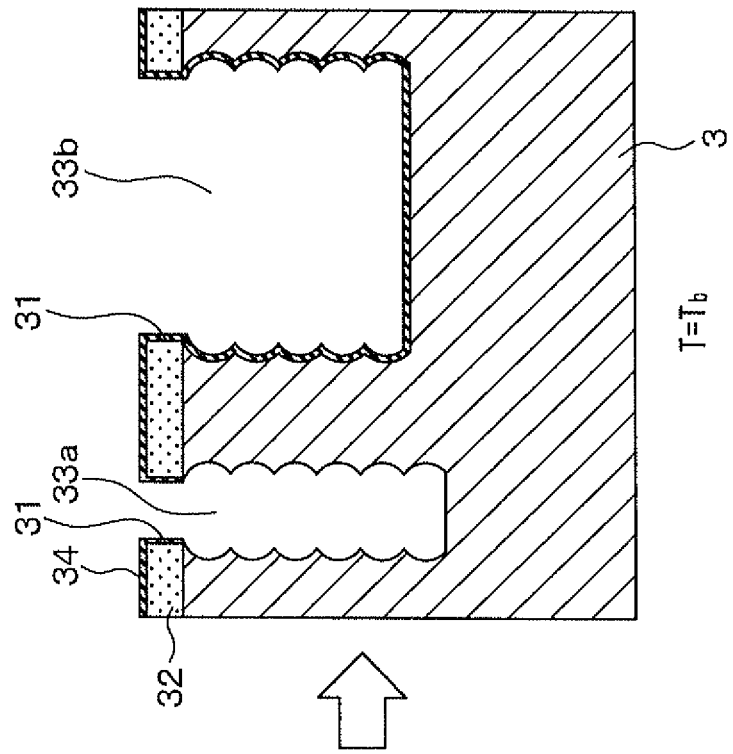
FIG. 17A is a diagram illustrating the first and second trenches at the time Ta in FIGS. 16A and 16B.
Figure 17B:
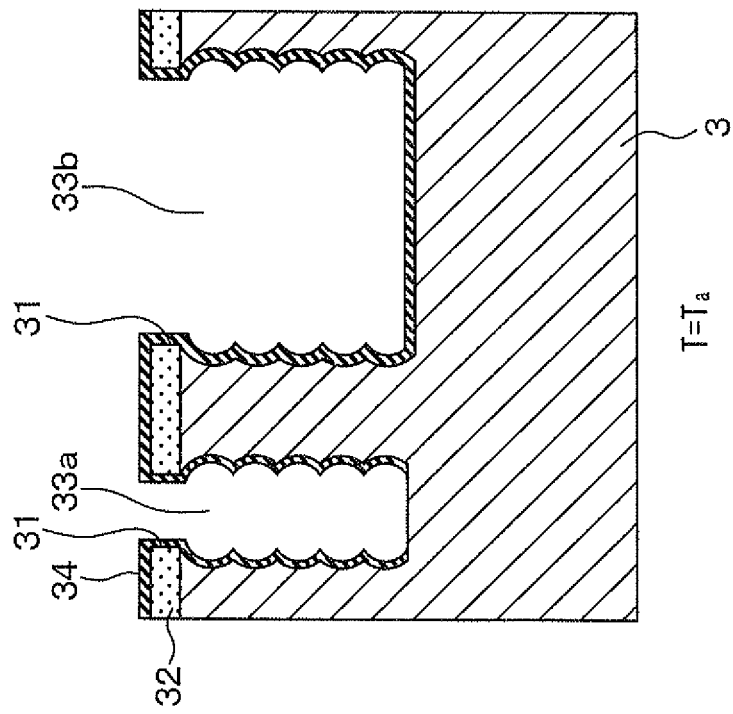
FIG. 17B is a diagram illustrating the first and second trenches at the time Tb in FIGS. 16A and 16B.
Figure 18:
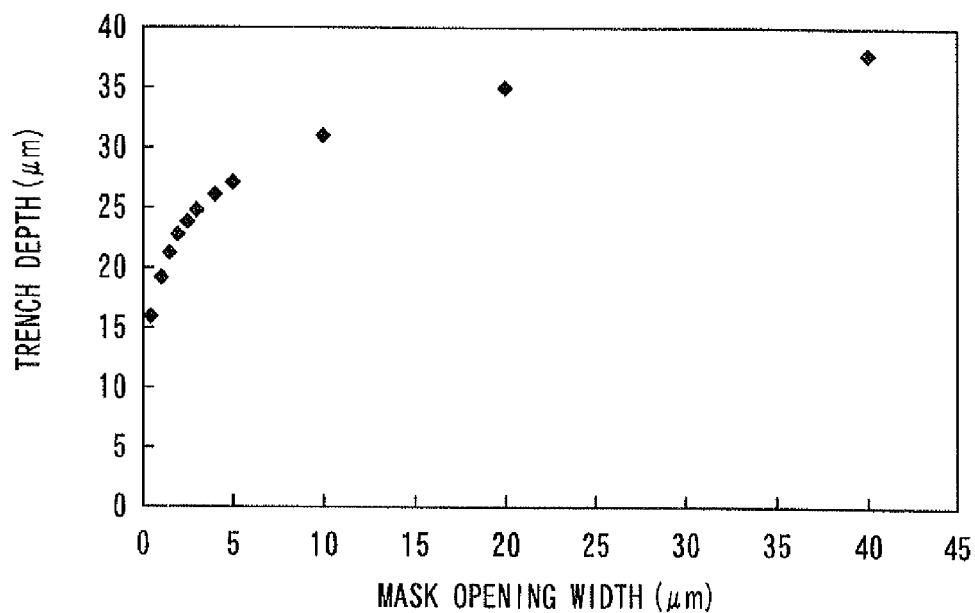
FIG. 18 is a diagram illustrating a relationship between a depth of a trench and a width of an opening of a mask when the trench is formed by a dry etching technique using the mask.
Figure 19:
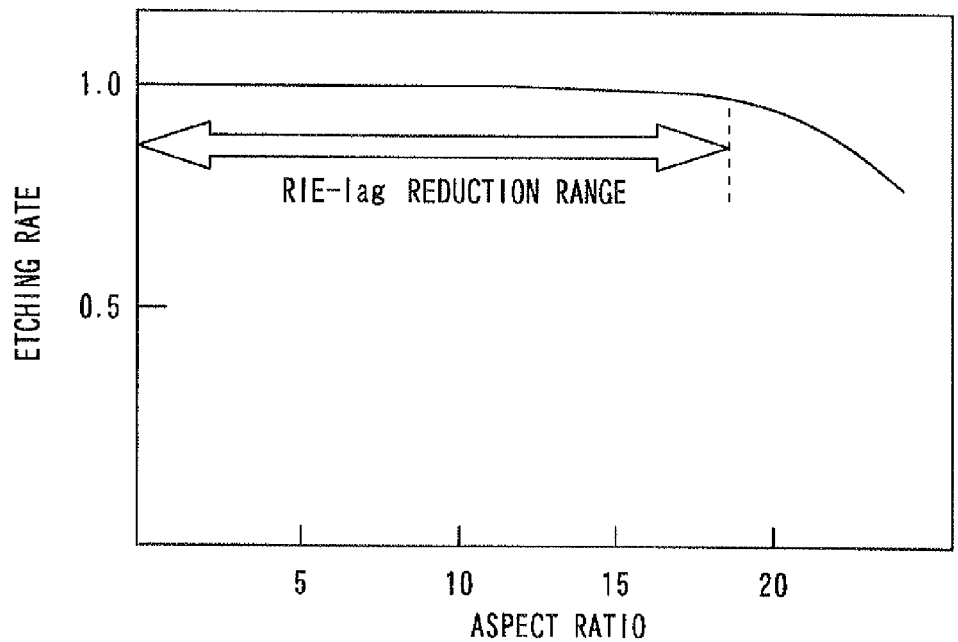
FIG. 19 is a diagram illustrating a RIE-lag reduction range.

FIG. 16A is a diagram illustrating a change in the intensity of the emission peak derived from F radical (or C$^+$ ion) when the first and second trenches 33a and 33b having different widths are simultaneously formed. FIG. 16B is a diagram illustrating a change in the bias RF power when the first and second trenches 33a and 33b are simultaneously formed. FIG. 17A is a diagram illustrating the first and second trenches 33a and 33b at the time Ta shown in FIGS. 16A and 16B, and FIG. 17B is a diagram illustrating the first and second trenches 33a and 33b at the time Tb shown in FIGS. 16A and 16B.

As can be seen from FIGS. 16A and 17A, the intensity of the emission peak derived from F radical slightly decreases at the time Ta. At the same time, the bias RF power is reduced to one lower level. It is noted that the time Ta is when the passivation layer 34 on the bottom of the first trench 33a is completely removed so that the Si layer can be exposed to the bottom of the first trench 33a. Then, as the etching step progresses, the passivation layer 34 on a side wall of the first trench 33a is gradually reduced. Then, the passivation layer 34 on the side wall of the first trench 33a is completely removed at the time Tb so that the Si layer can be exposed to the side wall of the first trench 33a. The intensity of the emission peak derived from F radical gradually decreases after the time Ta and becomes constant at the time Tb. The etching process switches from the etching step to the passivation step at the time Tb by setting the bias RF power to 0 watt (W) and by switching the gas introduced into the etching chamber 2 from SF6 gas to C4F8 gas. Then, after the passivation step is continued for a predetermined period of time, the etching process switches from the passivation step to the etching step. Such sequences are repeated.

In such an approach, it is possible to prevent the Si layer exposed to the side wall of the first trench 33a from being removed by the etching step. In other words, it is possible to prevent the width of the first trench 33a from being increased.

Thus, etching anisotropy is improved so that the etching can progress only in a depth direction of the first trench 33a. Therefore, the first trench 33a can have a high aspect ratio.

(Modifications)

The embodiments described above can be modified in various ways. For example, the embodiments can be applied to a substrate other than a silicon substrate. For example, the embodiments can be applied to form trenches having different widths in an active layer in a SOI substrate. That is, the embodiments can be applied to a substrate having a silicon layer. In the case of the SOI substrate, since a buried oxide layer of the SOI substrate can serve as an etching stopper, the depths of trenches having different widths can be made equal by performing etching until the trenches reach the buried oxide layer. However, there is a time lag between the trenches reach the buried oxide layer. The time lag may degrade etching anisotropy. Therefore, it is preferable that the reverse RIE-lag etching process according to the embodiments be applied to even the SOI substrate. In addition, the reverse RIE-lag etching process according to the embodiments can allow the depths of the trenches to be made equal, even when the trenches do not reach the buried oxide layer.

In the embodiments, the switch from the from the passivation layer removal sub-step to the Si-etching sub-step is detected based on the change in the intensity of the emission peak derived from F radical. Alternatively, the switch from the from the passivation layer removal sub-step to the Si-etching sub-step can be detected based on the change in the intensity of the emission peak derived from $C^+$ ion. It is noted that the intensity of the emission peak derived from $C^+$ ion gradually decreases during the etching step. Therefore, for example, the switch from the from the passivation layer removal sub-step to the Si-etching sub-step can be detected by comparing the intensity of the emission peak derived from $C^+$ ion with a threshold corresponding to when the passivation layer 34 on the bottom of the trench 33 is removed.

In the fourth embodiment, the passivation layer removal step is performed after the passivation step and the etching step are repeated multiple times. The fourth embodiment can be applied to the fifth through seventh embodiments as well as the first through third embodiments.

Such changes and modifications are to be understood as being within the scope of the present invention as defined by the appended claims.

What is claimed is:

1. A method of manufacturing a semiconductor device comprising:
   preparing a wafer having a silicon layer on which a mask having a plurality of openings is located, the plurality of openings having M different widths, where M is a positive integer more than one;
   placing the wafer in a chamber; and
   forming a plurality of trenches simultaneously in the silicon layer of the wafer through the mask, the plurality of trenches having M different widths defined by the plurality of openings of the mask, wherein
   the forming of the plurality of trenches includes alternately and repeatedly performing a passivation step and an etching step,
   the passivation step includes depositing a polymer passivation layer on a side wall and a bottom of the plurality of trenches by converting gas introduced in the chamber into plasma,
   the etching step includes removing the passivation layer on the bottom of the plurality of trenches until the silicon layer is exposed to the bottom and applying reactive ion etching to the exposed silicon layer to increase a depth of the plurality of trenches,
   the etching step further includes setting incident ion energy for the reactive ion etching to a predetermined energy value when the passivation layer on the bottom of the trench having the Nth smallest width is removed, where N is a positive integer less than M, and
   the energy value allows the etching amount of the silicon layer at the bottom of the trench having the Nth smallest width to be equal to or greater than the etching amount of the silicon layer at the bottom of the trench having the (N+1)th smallest width within a remaining time of the present etching step.

2. The method according to claim 1, wherein the energy value allows the passivation layer on the bottom of the trench having the (N+1)th smallest width to be completely removed within the remaining time of the present etching step.

3. The method according to claim 1, wherein the energy value prevents the passivation layer on the bottom of the trench having the (N+1)th smallest width to be removed.

4. The method according to claim 1, wherein the forming of the plurality of trenches includes performing a switch from the etching step to the passivation step when the passivation layer on a side wall of the trench having the smallest width is removed.

5. The method according to claim 1, wherein the forming of the plurality of trenches includes detecting when the passivation layer on the bottom of the trench having the Nth smallest width is removed by detecting a change in a waveform of an emission spectrum of the plasma using an emission spectrometer.

6. The method according to claim 5, wherein the waveform represents an intensity of an emission peak derived from F radical or $C^+$ ion.

7. The method according to claim 1, wherein the forming of the plurality of trenches further includes a passivation layer removal step for removing the passivation layer on the bottom of the plurality of trenches by inducing oxygen plasma in the chamber and by applying the oxygen plasma to the wafer, and
the passivation layer removal step is performed after the passivation step and the etching step are repeated a plurality of times.

8. A method of manufacturing a semiconductor device comprising:
   preparing a wafer having a silicon layer on which a mask having a plurality of openings is located, the plurality of openings having M different widths, where M is a positive integer more than one;
   placing the wafer in a chamber; and
   forming a plurality of trenches simultaneously in the silicon layer of the wafer through the mask, the plurality of trenches having M different widths defined by the plurality of openings of the mask, wherein
   the forming of the plurality of trenches includes alternately and repeatedly performing a passivation step and an etching step,
   the passivation step includes depositing a polymer passivation layer on a side wall and a bottom of the plurality of trenches by converting gas introduced in the chamber into plasma,
   the etching step includes removing the passivation layer on the bottom of the plurality of trenches until the silicon layer is exposed to the bottom and applying reactive ion etching to the exposed silicon layer to increase a depth of the plurality of trenches, the etching step further includes setting incident ion energy for the reactive ion etching to a predetermined energy value after a predetermined lapse time from when the passivation layer on the bottom of the trench having the smallest width is removed, and the energy value prevents the passivation layer from being removed.

9. The method according to claim 8, wherein the forming of the plurality of trenches includes performing a switch from the etching step to the passivation step when the passivation layer on a side wall of the trench having the smallest width is removed.

10. The method according to claim 8, wherein the forming of the plurality of trenches includes detecting when the passivation layer on the bottom of the trench having the smallest width is removed by detecting a change in a waveform of an emission spectrum of the plasma using an emission spectrometer.

11. The method according to claim 10, wherein the waveform represents an intensity of an emission peak derived from F radical or $C^+$ ion.

12. The method according to claim 8, wherein the forming of the plurality of trenches includes a passivation layer removal step for removing the passivation layer on the bottom of the plurality of trenches by inducing oxygen plasma in the chamber and by applying the oxygen plasma to the wafer, and the passivation layer removal step is performed after the passivation step and the etching step are repeated a plurality of times.

* * * * *